United States Patent
Kuranaga et al.

(10) Patent No.: US 8,759,126 B2
(45) Date of Patent: Jun. 24, 2014

(54) IMAGE DISPLAY DEVICE AND THE METHOD FOR MANUFACTURING THE SAME

(75) Inventors: Takahide Kuranaga, Mobara (JP); Takashi Hattori, Musashimurayama (JP); Naoya Okada, Tsukuba (JP); Mutsuko Hatano, Kokubunji (JP)

(73) Assignees: Japan Display Inc., Tokyo (JP); Panasonic Liquid Crystal Display Co., Ltd., Hyogo (JP)

( * ) Notice: Subject to any disclaimer, the term of this patent is extended or adjusted under 35 U.S.C. 154(b) by 197 days.

(21) Appl. No.: 13/092,226

(22) Filed: Apr. 22, 2011

(65) Prior Publication Data

US 2011/0260180 A1    Oct. 27, 2011

(30) Foreign Application Priority Data

Apr. 22, 2010 (JP) .................................. 2010-098645

(51) Int. Cl.
   *H01L 21/00*    (2006.01)
   *G02F 1/1333*   (2006.01)

(52) U.S. Cl.
   USPC .................. 438/28; 438/33; 438/458; 257/88; 349/122

(58) Field of Classification Search
   USPC .............. 438/30, 33, 42, 28, 458; 349/92–94, 349/122–124, 128, 138; 257/620, 88
   See application file for complete search history.

(56) References Cited

U.S. PATENT DOCUMENTS

| | | | |
|---|---|---|---|
| 5,686,360 A | 11/1997 | Harvey, III et al. | |
| 7,189,999 B2 * | 3/2007 | Yamazaki et al. | 257/72 |
| 7,510,950 B2 * | 3/2009 | Tsurume et al. | 438/462 |
| 7,638,408 B2 * | 12/2009 | Yamazaki et al. | 438/406 |
| 7,863,155 B2 * | 1/2011 | Yamazaki et al. | 438/458 |
| 7,879,687 B2 * | 2/2011 | Yamada | 438/455 |
| 7,989,811 B2 * | 8/2011 | Yamada | 257/67 |
| 8,324,079 B2 * | 12/2012 | Takahashi et al. | 438/458 |
| 8,334,086 B2 * | 12/2012 | Sawano | 430/200 |
| 2005/0116637 A1 | 6/2005 | Yoshizawa | |
| 2005/0130391 A1 * | 6/2005 | Takayama et al. | 438/458 |
| 2005/0168136 A1 | 8/2005 | Sugimoto et al. | |
| 2006/0121694 A1 * | 6/2006 | Tamura | 438/458 |
| 2006/0270191 A1 * | 11/2006 | Tamura et al. | 438/458 |
| 2006/0273319 A1 * | 12/2006 | Dairiki et al. | 257/66 |
| 2007/0010067 A1 * | 1/2007 | Shimoda et al. | 438/455 |

(Continued)

FOREIGN PATENT DOCUMENTS

| | | |
|---|---|---|
| JP | 09-161967 | 6/1997 |
| JP | 9-254303 | 9/1997 |
| JP | 2003-282238 | 10/2003 |
| JP | 2005-123012 | 5/2005 |

*Primary Examiner* — Cheung Lee
*Assistant Examiner* — Jeremy Joy
(74) *Attorney, Agent, or Firm* — Antonelli, Terry, Stout & Krauss, LLP.

(57) ABSTRACT

An image display device comprises: a first substrate having flexure property; a first resin layer which is attached to the first substrate and over which thin film transistors are located; a barrier layer which comprises an inorganic film covering a surface of the resin layer; and a first thin film layer and a second thin film layer which are located so as to sandwich the first resin layer with the barrier layer disposed therebetween.

2 Claims, 18 Drawing Sheets

(56) References Cited

U.S. PATENT DOCUMENTS

| | | |
|---|---|---|
| 2007/0128774 A1* | 6/2007 | Yamada ........................ 438/149 |
| 2008/0292786 A1 | 11/2008 | Hatano et al. |
| 2009/0021678 A1* | 1/2009 | Son et al. ...................... 349/122 |
| 2009/0040411 A1* | 2/2009 | Kawamura et al. ............. 349/46 |
| 2009/0183766 A1* | 7/2009 | Takahashi et al. ............ 136/255 |
| 2010/0013372 A1 | 1/2010 | Oikawa et al. |
| 2010/0134713 A1* | 6/2010 | Toyoda et al. .................. 349/58 |
| 2011/0156062 A1 | 6/2011 | Kim et al. |
| 2011/0294244 A1* | 12/2011 | Hattori et al. ................... 438/34 |

* cited by examiner

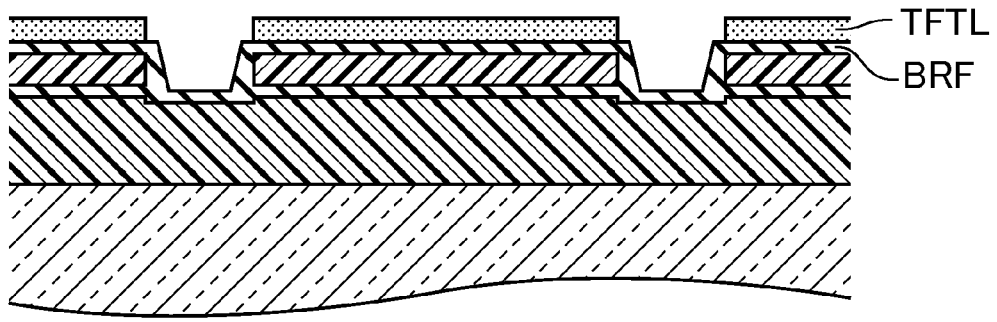
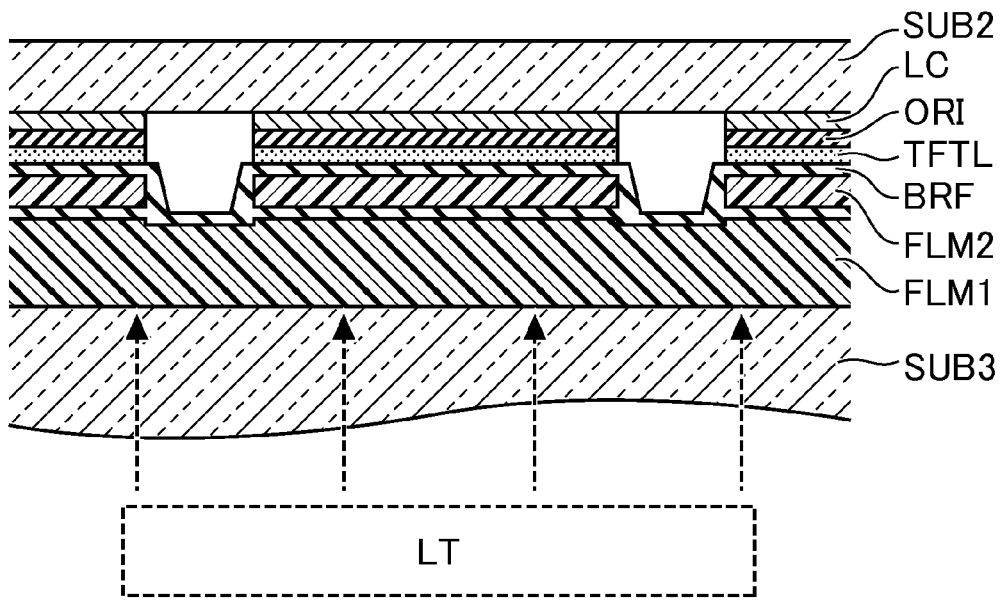
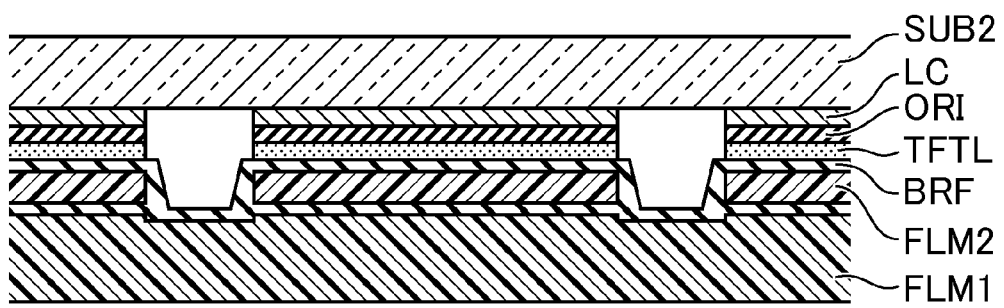

IMAGE DISPLAY DEVICE AND THE METHOD FOR MANUFACTURING THE SAME

CROSS-REFERENCE TO RELATED APPLICATION

The present application claims priority from Japanese application JP 2010-098645 filed on Apr. 22, 2010, the content of which is hereby incorporated by reference into this application.

BACKGROUND OF THE INVENTION

1. Field of the Invention

The invention relates to an image display device and a method for manufacturing the same.

2. Description of the Related Art

Liquid crystal display devices mainly include a pair of substrates in which a liquid crystal is interposed therebetween and a back light, and include a display region in which a plurality of pixels are provided on principal surfaces of the pair of substrates. These pixels are configured to independently generate an electric field that drives liquid crystal molecules, whereby light transmittance corresponding to the driving of the liquid crystal molecules is obtained. Moreover, a liquid crystal display device in which glass substrates or plastic (resin) substrates are used as a pair of substrates, and a display surface having flexure property, that is, being configured to be bent easily is known. The liquid crystal display device having such a configuration has excellent impact resistance and flexibility, and commercialization thereof is much needed.

Particularly, in a liquid crystal display device in which a resin film FLM is used as a first substrate SUB1, a TFT layer TFTL is provided on the resin film FLM (the first substrate SUB1), as shown in FIG. 46. On the other hand, in a liquid crystal display device in which a plastic substrate is used as a first substrate SUB1, a resin film FLM is provided between the first substrate SUB1 and the TFT layer TFTL, as shown in FIG. 47. In the liquid crystal display devices shown in FIGS. 46 and 47, properties of thin film transistors in the TFT layer TFTL change greatly due to the effect of moisture and oxygen penetrating through the plastic substrate and the resin film serving as the first substrate SUB1. Therefore, in the liquid crystal display device of the related art, as shown in FIG. 48, a barrier layer BRF is provided between the first substrate SUB1 and the resin film FLM and between the resin film FLM and the TFT layer TFTL to thereby block moisture, oxygen, and the like penetrating through the first substrate SUB1 formed of the plastic substrate which is a resin member and the resin film FLM. Thus, it is possible to prevent the moisture, oxygen, and the like from affecting the properties of the thin film transistors formed in the TFT layer TFTL. As a resin film used in the liquid crystal display device having such a configuration, a transparent conductive film disclosed in JP-9-254303A is known, for example.

In manufacturing of an image display device having a liquid crystal display device, thin film transistors, electrodes, and the like necessary for forming a plurality of display devices are formed on one of a pair of substrates called mother substrates, and color filters and the like are formed on the other mother substrate. Thereafter, the pair of mother substrates are fixed by a sealing material to thereby form the plurality of display devices (hereinafter referred to as unit display devices) in the pair of mother substrates, and then, the mother substrates are cut to be divided into the unit display devices, whereby a plurality of liquid crystal display devices are manufactured at one time.

However, in manufacturing of the liquid crystal display device by such a method, side surfaces (edge portions or cutting surfaces) of the plastic substrate and the resin film on which the barrier layer is formed are exposed to the atmosphere. Therefore, it is difficult to block moisture and oxygen from the side surfaces of the plastic substrate and the resin film. Thus, there is a possibility that the properties of the thin film transistors formed on the TFT layer change greatly.

SUMMARY OF THE INVENTION

The invention provides an image display device capable of preventing penetration of moisture, oxygen, and the like into a TFT layer and a method for manufacturing the same.

According to an aspect of the invention, there is provided an image display device including: a first substrate having flexure property; a first resin layer which is attached to the first substrate and over which thin film transistors are located; a barrier layer which comprises an inorganic film covering a surface of the first resin layer; and a first thin film layer and a second thin film layer which are located so as to sandwich the first resin layer with the barrier layer disposed therebetween.

In the image display device, the first thin film layer may be a second resin layer which is located under the first resin layer with the barrier layer disposed therebetween, and the second thin film layer may be a circuit layer which is located on the first resin layer with the barrier layer disposed therebetween and which constitutes the thin film transistors. In this case, the second resin layer may have a transmittance of 50% or less with respect to light having a wavelength of 200 nm or more and 450 nm or less. Here, the light having the wavelength of 200 nm or more and 450 nm or less may be XeCl excimer laser light having a wavelength of 308 nm, KrF excimer laser light having a wavelength of 248 nm, a third harmonic (wavelength: 355 nm) of a YAG laser (wavelength: 1064 nm), or a fourth harmonic (wavelength: 266 nm) of a YAG laser (wavelength: 1064 nm). Moreover, in this case, the second resin layer may comprise at least one resin material selected from polybenzoxazole, polyamidoimide having an alicyclic structure, polyimide having an alicyclic structure, polyamide, and poly(p-xylylene). Furthermore, in this case, the second resin layer may have a thickness of 1 μm or more and 30 μm or less.

In the image display device, the first resin layer may comprise at least one resin material selected from polybenzoxazole, polyamidoimide having an alicyclic structure, polyimide having an alicyclic structure, polyamide, and poly(p-xylylene).

In the image display device, the first resin layer may have a thickness of 1 μm or more and 30 μm or less.

In the image display device, the barrier layer may comprise at least one inorganic material selected from silicon oxide (SiO), silicon oxynitride (SiON), silicon nitride (SiN), and aluminum oxide (AlO).

In the image display device, the barrier layer may have a thickness of 10 nm or more and 2000 nm or less.

In the image display device, the first resin layer may have a transmittance of 50% or less with respect to light having a wavelength of 200 nm or more and 450 nm or less. In this case, the light having the wavelength of 200 nm or more and 450 nm or less may be XeCl excimer laser light having a wavelength of 308 nm, KrF excimer laser light having a wavelength of 248 nm, a third harmonic (wavelength: 355 nm) of a YAG laser (wavelength: 1064 nm), or a fourth harmonic (wavelength: 266 nm) of a YAG laser (wavelength: 1064 nm).

In the image display device, the image display device may further comprise a second substrate having flexure property, and a liquid crystal material may be disposed between the first substrate and the second substrate.

In the image display device, the image display device may further comprise a light emitting layer which is located on the circuit layer and constitutes an organic EL element; and a sealing layer which is located on the light emitting layer and protects the light emitting layer.

According to another aspect of the invention, there is provided a method for manufacturing an image display device, comprising: forming a resin layer on a third substrate; forming a semiconductor element comprising thin film transistors on the resin layer; separating the third substrate from the resin layer on which the semiconductor element is formed; forming grooves that are shallower than a thickness of the resin layer on an upper surface side of the resin layer; and irradiating light to the resin layer from a side on which the third substrate was existed.

In the method for manufacturing the image display device, the resin layer may comprise a first resin layer and a second resin layer, the forming the resin layer on the third substrate may comprise: forming the second resin layer on the third substrate; forming a barrier layer that is formed of an inorganic material on the second resin layer; and forming the first resin layer on the barrier layer, and the forming the grooves on the upper surface side of the resin layer may comprise forming the grooves so as to penetrate through the first resin layer and the barrier layer so that a part of the second resin layer remains on bottom portions of the grooves.

In the method for manufacturing the image display device, the method may further comprise cutting the image display device for at least one display region formed on a region where the semiconductor element is formed, and the grooves may be formed so as to overlap the cutting positions.

According to the aspects of the invention, it is possible to prevent moisture, oxygen, and the like from penetrating into the TFT layer.

The other advantages of the invention will be understood from the description of the entire specification.

BRIEF DESCRIPTION OF THE DRAWINGS

FIG. 20 is a diagram illustrating a method for manufacturing the liquid crystal display device which is the image display device according to the second embodiment of the invention.

FIG. 21 is a diagram illustrating a method for manufacturing the liquid crystal display device which is the image display device according to the second embodiment of the invention.

FIG. 22 is a diagram illustrating a method for manufacturing the liquid crystal display device which is the image display device according to the second embodiment of the invention.

DETAILED DESCRIPTION OF THE INVENTION

Figure 1A:
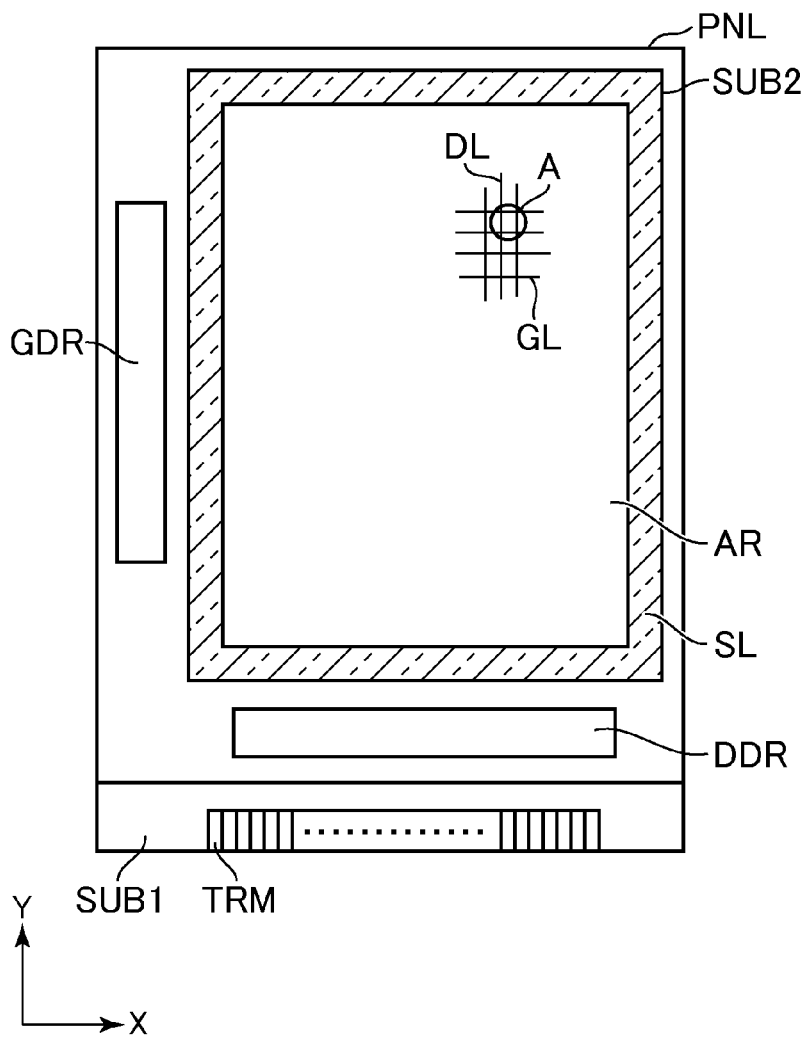
FIG. 1A is a planar view illustrating a schematic configuration of a liquid crystal display device which is an image display device according to a first embodiment of the invention.

Hereinafter, embodiments to which the invention is applied will be described with reference to the drawings. In the following description, the same constituent elements will be denoted by the same reference numerals, and redundant description thereof will be omitted.

1. First Embodiment 1.1. Overall Configuration

Figure 1B:
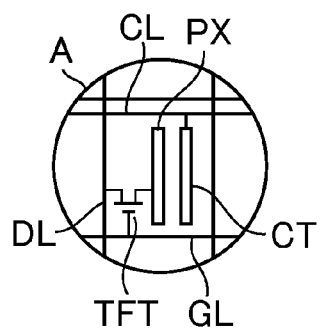
FIG. 1B is an enlarged view of a portion of a circle A in FIG. 1A.

FIG. 1 is a planar view illustrating a schematic configuration of a liquid crystal display device which is an image display device according to a first embodiment of the invention. In FIG. 1, X and Y indicate an X axis and a Y axis, respectively. In the following description, although a configuration in which a plastic substrate is used as a first substrate SUB1 is described, the invention is not limited to this, and a resin film may be used as the first substrate SUB1.

The liquid crystal display device according to the first embodiment shown in FIG. 1 includes a liquid crystal display panel PNL which includes the first substrate (TFT-side substrate) SUB1 on which thin film transistors TFT, pixel electrodes, and the like are formed, a second substrate (opposing substrate) SUB2 which is disposed so as to face the first substrate SUB1 and on which color filters (coloring layer), a black matrix (light blocking layer), and the like are formed, and liquid crystals (not shown) which are interposed between the first substrate SUB1 and the second substrate SUB2. The liquid crystal display panel PNL and a backlight unit (not shown) serving as a light source are assembled together, whereby the liquid crystal display device is obtained. The first substrate SUB1 and the second substrate SUB2 are fixed by a sealing material SL formed around a display region AR, whereby the liquid crystals interposed between the two substrates SUB1 and SUB2 are sealed. The image display device of the first embodiment has flexure property, that is, being configured to be bent easily.

The first substrate SUB1 and the second substrate SUB2 are known plastic (resin) substrates, for example. The first substrate SUB1 and the second substrate SUB2 are configured to be bent easily and can be transparent substrates. Given the above, since the liquid crystal display device of the first embodiment uses the plastic (resin) substrates, the liquid crystal display device is light and has excellent impact resistance, flexibility, and the like. Moreover, in the liquid crystal display device of the first embodiment, a portion of a region where the liquid crystals are enclosed, in which display pixels (hereinafter simply referred to as pixels) are formed, serves as the display region AR. Thus, portions within the region where the liquid crystals are enclosed, in which no pixel is formed, and which are not associated with display, do not become the display region AR.

Furthermore, in the liquid crystal display device of the first embodiment, low-temperature polysilicon TFTs (LTPS) are used as the thin film transistors TFT, a video signal driving circuit (drain driver) DDR is provided on the first substrate SUB1 in a lower part of the figure, and a scanning signal driving circuit (gate driver) GDR is provided on the first substrate SUB1 on a left side of the figure. In the following description, when it is not necessary to distinguish the drain driver DDR and the gate driver GDR from each other, they will be simply referred to as a driving circuit (driver).

As shown in FIG. 1, in the liquid crystal display device of the first embodiment, scanning lines (gate lines) GL which extend in the X direction and are arranged in the Y direction in the figure are provided on a portion of a liquid crystal-side surface of the first substrate SUB1 which is disposed within the display region AR. Moreover, video signal lines (drain lines) DL which extend in the Y direction and are arranged in the X direction in the figure are provided.

Rectangular regions surrounded by the drain lines DL and the gate lines GL form regions where pixels are formed, and accordingly, the respective pixels are arranged in a matrix form in the display region AR. Moreover, in the pixel regions, color filters (not shown) of one of three colors of red (R), green (G), and blue (B) are formed. Particularly, in the liquid crystal display device of the first embodiment, the respective pixels of the colors R, G, and B which are adjacent in the X-axis direction, namely the extension direction of the gate lines GL form unit pixels for color display. However, the configuration of the unit pixel for color display is not limited to this. Moreover, a black matrix and an alignment film which extend in the extension direction of the gate lines GL are formed on the second substrate SUB2.

Moreover, as shown in an enlarged view of a portion of a circle A in FIG. 1A, for example, each of the respective pixels includes the thin film transistor TFT which is turned ON by a scanning signal from the gate line GL, a pixel electrode PX to which a video signal from the drain line DL is supplied through the turned-ON thin film transistor TFT, and a common electrode CT which is connected to a common line CL and to which a reference signal having a potential used as a reference potential of the video signal is supplied. An electric field having a component parallel to a surface of the first substrate SUB1 is generated between the pixel electrode PX and the common electrode CT, and liquid crystal molecules are driven by the electric field. Such a liquid crystal display device is known as one that can perform so-called wide viewing angle display, and such a display mode is called an IPS mode or a horizontal electric field mode due to its characteristics of applying the electric field to the liquid crystals. In the configuration of the common electrode CT shown in the enlarged view A, although the reference signal is input through the common line CL to the common electrode CT which is independently formed for each pixel, the invention is not limited to this, and the common electrode CT may be formed in a planar form so as to extend over a plurality of pixels, for example.

In the liquid crystal display device of the first embodiment, ends of the respective drain lines DL and the respective gate lines GL extend over the sealing material SL and are connected to the drain driver DDR or the gate driver GDR. Here, in the liquid crystal display device of the first embodiment, as described above, the drain driver DDR and the gate driver GDR which are liquid crystal display device drivers are formed on the first substrate SUB1 using the LTPS.

On the other hand, signal lines through which a control signal from the external device is input to the drain driver DDR and the gate driver GDR are formed on the first substrate SUB1 together with the drain driver DDR and the gate driver GDR. Moreover, the other ends of the signal lines are connected to an electrode terminal TRM which is formed on an opposing-surface side (liquid crystal surface side) of the first substrate SUB1, and the control signal from the external device is input to the liquid crystal display device through the electrode terminal TRM. Therefore, the liquid crystal display device of the first embodiment has a shape such that the second substrate SUB2 is recessed more than the first substrate SUB1 on the side where the electrode terminal TRM is formed. That is, an upper part of the electrode terminal TRM is exposed to the outside, and a flexible wiring substrate (not shown) is connected to the electrode terminal TRM using a known anisotropic conductive film, whereby the control signal from the external device is input to the liquid crystal display device.

In the liquid crystal display device of the first embodiment, although the drain driver DDR and the gate driver GDR are formed on the first substrate SUB1 using the LTPS, the invention is not limited to this. For example, the drain driver and the gate driver may be formed by semiconductor devices that are formed of semiconductor chips, and the semiconductor chips may be mounted on the first substrate SUB1. Alternatively, one side of a semiconductor device which is formed by a tape carrier method or a chip-on film (COF) method, for example, may be connected to the first substrate SUB1.

1.2. Detailed Configuration of First Substrate

Figure 2:
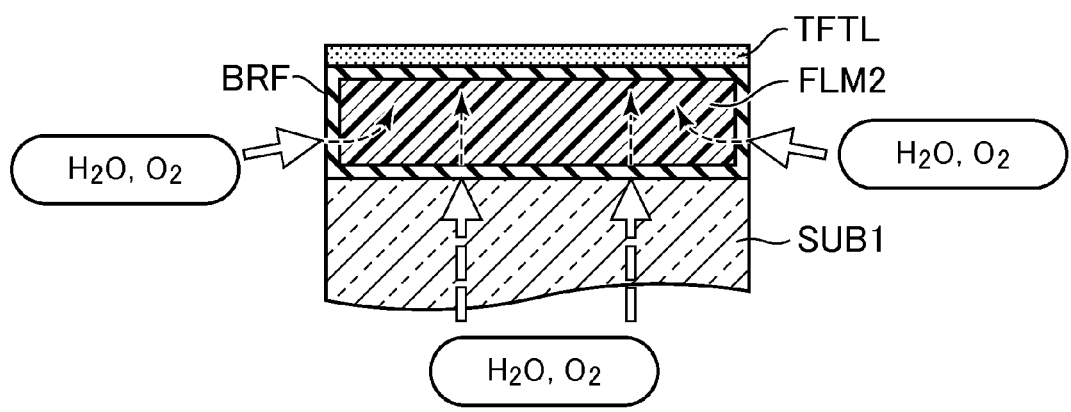
FIG. 2 is a diagram illustrating a detailed configuration of a first substrate in the liquid crystal display device which is the image display device of the invention.

FIG. 2 is a diagram illustrating a detailed configuration of the first substrate SUB1 in the liquid crystal display device which is the image display device of the invention. In the figure, bold dotted arrows indicate an example of penetration paths of moisture ($H_2O$), oxygen ($O_2$), and the like in the atmosphere, and narrow dotted arrows indicate moisture ($H_2O$), oxygen ($O_2$), and the like blocked by a barrier layer. Moreover, in the following description, in order to simplify the description, a thin film region including the thin film transistors TFT, the pixel electrodes PX, and the like will be referred to as a TFT layer TFTL (second thin film layer).

As shown in FIG. 2, in the first substrate SUB1 of the liquid crystal display device of the first embodiment, a barrier layer BRF is provided on the upper surface of the first substrate SUB1, namely an opposing surface side facing liquid crystals (not shown), and a resin film (first resin layer) FLM2 is provided on an upper surface of the barrier layer BRF. Moreover, the barrier layer BRF is formed on an upper surface of the resin film FLM2, and the TFT layer TFTL is formed on an upper surface of the barrier layer BRF. Furthermore, in the resin film FLM2 of the first embodiment, the barrier layer BRF is also disposed on side surfaces thereof. That is, in the first substrate SUB1 of the first embodiment, the resin film FLM2 is surrounded by the barrier layers BRF, and the resin film FLM2 surrounded by the barrier layers BRF is provided between the first substrate SUB1 and the TFT layer TFTL.

Since the liquid crystal display device of the first embodiment has such a structure, moisture $H_2O$, oxygen $O_2$, and the like in the atmosphere which penetrate into the resin film FLM2 through a rear surface side of the liquid crystal display device of the first embodiment, namely the first substrate SUB1 formed of the plastic substrate are blocked by the barrier layer BRF provided in a region between the first substrate SUB1 and the resin film FLM2 and prevented from penetrating into a resin film FLM2 side. Similarly, moisture $H_2O$, oxygen $O_2$, and the like which penetrate into the resin film FLM2 from side surface sides of the liquid crystal display device of the first embodiment, namely the atmosphere are blocked by the barrier layers BRF provided in the side surface portions of the resin film FLM2 and prevented from penetrating into the resin film FLM2 side. Moreover, in the liquid crystal display device of the first embodiment, the barrier layer BRF is also provided between the resin film FLM2 and the TFT layer TFTL. Therefore, even when part of the moisture $H_2O$, the oxygen $O_2$, and the like have penetrated through the barrier layer BRF provided in the region between the first substrate SUB1 and the resin film FLM2 or the barrier layer BRF provided in the side surface portions of the resin film FLM2, the barrier layer BRF between the resin film FLM2 and the TFT layer TFTL can prevent the moisture $H_2O$, the oxygen $O_2$, and the like which have penetrated from penetrating into the TFT layer TFTL. That is, in the liquid crystal display device of the first embodiment, since all of outer circumferential surfaces of the resin film FLM2 formed on the upper surface side (the opposing surface side) of the first substrate SUB1 are covered by the barrier layer BRF, it is possible to prevent the moisture $H_2O$, the oxygen $O_2$, and the like in the atmosphere from penetrating into the TFT layer TFTL. As a result, it is possible to suppress changes in the properties of the thin film transistors TFT formed on the TFT layer TFTL and to suppress fluctuation and the like of a display luminance in each pixel. Thus, it is possible to improve the display quality of the liquid crystal display device.

1.3. Manufacturing Method

Figure 13:
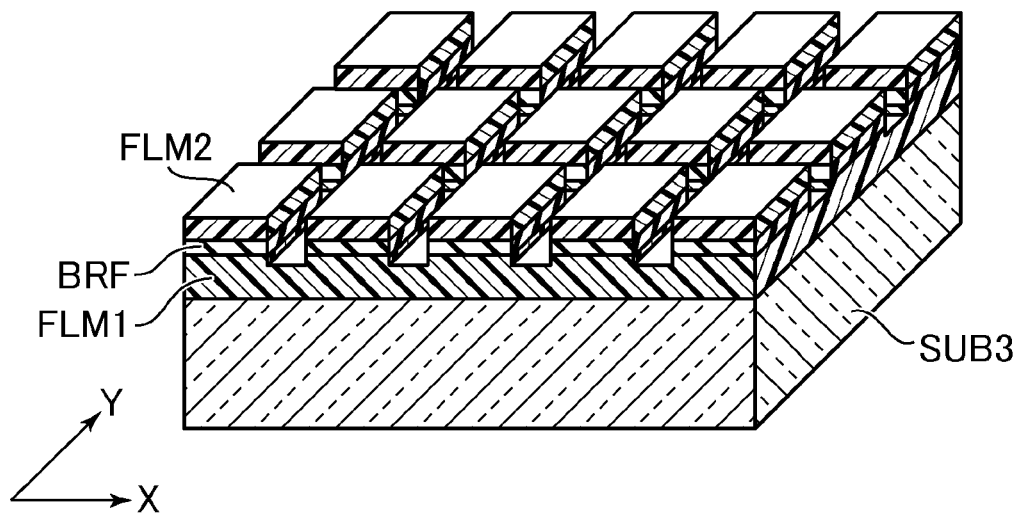
FIG. 13 is a perspective view illustrating a state in step 1-4 of the liquid crystal display device according to the first embodiment of the invention.

Next, a method for manufacturing the liquid crystal display device according to the first embodiment will be described with reference to FIGS. 3 to 11 and FIG. 13. FIGS. 3 to 11 are diagrams illustrating the method for manufacturing the liquid crystal display device which is an image display device according to the first embodiment of the invention, and FIG. 13 is a perspective view illustrating a state in step 1-4 of the liquid crystal display device according to the first embodiment of the invention. Since the respective thin films can be formed by a known photolithography technique, detailed description of a forming method thereof will be omitted.

In the following description, a method of forming the liquid crystal display device using a so-called separation method in which the TFT layer TFTL is formed on a third substrate SUB3 formed of a glass substrate serving as a mother substrate, and the TFT layer TFTL is separated from the third substrate SUB3 and attached to the first substrate SUB1 which is a plastic substrate is described. However, the method for manufacturing the image display device according to the first embodiment is not limited to this. The invention can be also applied to when other techniques are used.

Figure 3:
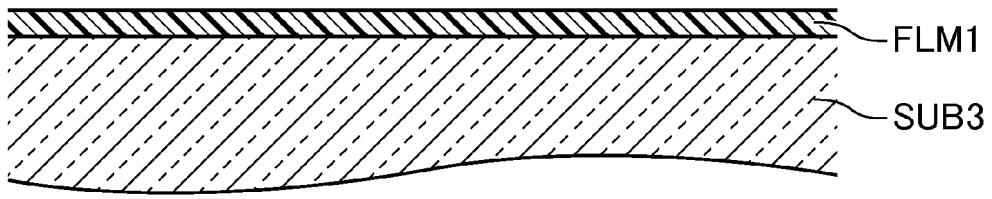
FIG. 3 is a diagram illustrating a method for manufacturing the liquid crystal display device which is the image display device according to the first embodiment of the invention.

1.3.1. Step 1-1 (FIG. 3)

First, a resin film FLM1 (second resin layer or first thin film layer) is formed on a surface of the third substrate SUB3 formed of a glass substrate serving as a base member for forming the TFT layer TFTL. A thickness of the resin film FLM1 at this time is sufficient for a thickness necessary for forming grooves (recesses) CP described later. Moreover, the resin film FLM1 is formed of a known resin member having properties such that it can be separated from the third substrate SUB3 through irradiation of laser light which will be described in detail later. Furthermore, the third substrate SUB3 is a mother substrate and has a size such that a plurality of the liquid crystal display devices can be formed from the third substrate SUB3.

At that time, the third substrate SUB3 is not limited to the glass substrate, and a quartz substrate, a silicon substrate (for example, a Si wafer), a metal substrate, and the like can be used. In this case, from the perspective of enabling irradiation of light from a rear surface, a transparent glass substrate, a transparent quartz substrate, and the like are preferred. Moreover, in the present embodiment, in a later step, the third substrate SUB3 is separated from the resin film FLM1. Therefore, the third substrate SUB3 is not affected and can be regenerated, and the cost of the liquid crystal display device can be reduced.

Moreover, the resin film FLM1 is one preferably containing a resin material selected from polybenzoxazole, polyamidoimide having an alicyclic structure, polyimide having an alicyclic structure, polyamide, and poly (p-xylylene), and the resin film FLM1 may contain these materials singly or in combination. Since the resin film FLM1 containing these resin materials has a strength to some extent by itself, the film can be separated as a single film after being formed on the third substrate SUB3. Therefore, the resin film FLM1 is advantageous since fracture rarely occurs even when the TFT layer TFTL is formed thereon and then separated.

Moreover, the thickness of the resin film FLM1 is 1 μm or more and 30 μm or less, and preferably 3 μm or more and 25 μm or less, and more preferably 4.5 μm or more and 15 μm or less. The resin film FLM1 having such a thickness is excellent in terms of the transparency since a decrease in the transmittance by absorption to the resin can be prevented and also has a mechanical strength as a film.

Furthermore, the resin film FLM1 has a transmittance of 80% or higher, and preferably, 90% or higher, and more preferably, 95% or higher to light in a visible light region, particularly, having a wavelength of 400 nm or more and 800 nm or less, since the resin film FLM1 having such a transmittance to light efficiently allows light to transmit therethrough.

Furthermore, the resin film FLM1 has 3 wt % weight loss temperature of 300° C. or higher, and preferably, 1 wt % weight loss temperature of 300° C. or higher.

Figure 4:
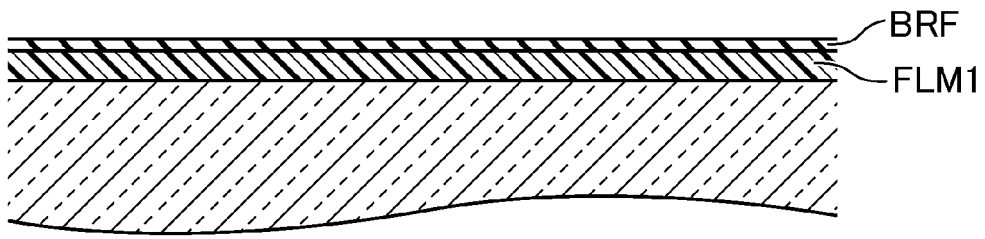
FIG. 4 is a diagram illustrating a method for manufacturing the liquid crystal display device which is the image display device according to the first embodiment of the invention.

1.3.2. Step 1-2 (FIG. 4)

Subsequently, a silicon nitride film or the like, for example, is stacked so as to cover an upper surface of the resin film FLM1 to form the barrier layer (first barrier layer) BRF. However, the barrier layer BRF is not limited to the silicon nitride film, and a film formed of other materials can be used.

For example, the barrier layer BRF preferably includes at least one material selected from silicon oxide (SiO), silicon oxynitride (SiON), silicon nitride (SiN), and aluminum oxide (AlO). The barrier layer BRF may contain these materials singly or in combination.

Moreover, a thickness of the barrier layer BRF is usually 10 nm or more and 2000 nm or less, and preferably, 50 nm or more and 500 nm or less. The barrier layer BRF may be a single layer or may be a stacked member of two or more layers as necessary.

A method for forming the barrier layer BRF includes, sputtering, reactive plasma deposition, CVD, plasma CVD, and the like. At that time, since the barrier layer BRF is formed on the resin film FLM1 which is an organic material, a low temperature is preferred as a formation temperature of the barrier layer BRF since the resin film FLM1 undergoes less damage. Specifically, the barrier layer BRF is preferably formed of a material which can be formed at a temperature of 100° C. or lower.

Figure 5:
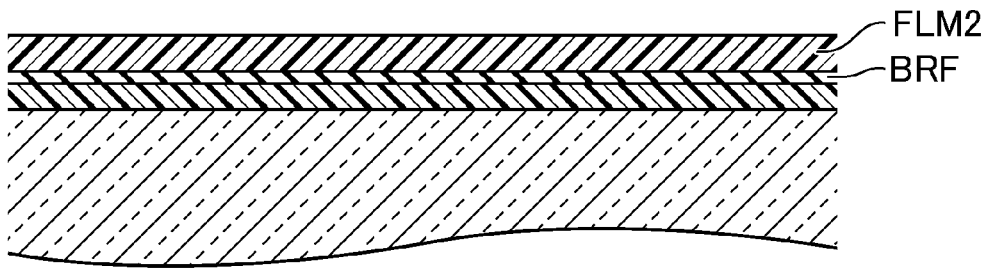
FIG. 5 is a diagram illustrating a method for manufacturing the liquid crystal display device which is the image display device according to the first embodiment of the invention.

1.3.3. Step 1-3 (FIG. 5)

Subsequently, the resin film FLM2 (first resin layer) is formed so as to cover an upper surface of the barrier layer BRF. At that time, the resin film FLM2 is formed to a predetermined thickness since it becomes the resin film FLM2 when the third substrate SUB3 which is the mother substrate is separated.

The resin film FLM2 of the first embodiment preferably has a thermal expansion coefficient which has a value between that of the third substrate SUB3 and that of the resin film FLM1. When a glass substrate or a silicon substrate is used as the third substrate SUB3, the thermal expansion coefficients of the substrates have a value of several ppm/K. In contrast, the thermal expansion coefficient of the resin film FLM1 is usually greater by one digit or more, that is, from several tens to 100 ppm/K. Therefore, since the difference in the thermal expansion coefficient between the third substrate SUB3 and the resin film FLM1 is large, there is a possibility that stress may occur in the resin film FLM1, and the resin film FLM1 may crack upon curing of the resin film FLM1. These problems can be mitigated by using the resin film FLM2 of which the thermal expansion coefficient has the value between that of the third substrate SUB3 and that of the resin film FLM1.

Moreover, the resin film. FLM2 maybe a single layer or plural layers. For example, resin layers of which the thermal expansion coefficients are ordered can be stacked into three or more layers.

Moreover, the resin film FLM2 is one preferably having heat resistance, and specifically, a thermal expansion coefficient of 10 to 40 ppm/K, a thickness of 1 µm or more and 30 µm or less, and 1 wt % weight loss temperature of 300° C. or higher are preferred. As for the transmittance of the resin film FLM2, transparent films having a transmittance of 80% or higher to visible light having a wavelength of 400 nm or more and 800 nm or less may be used.

Examples of such a resin material include polyimide, polyamidoimide, polyamide, and polybezoxazole. More specifically, similarly to the resin film FLM1, the resin film FLM2 preferably contains a resin material selected from polybenzoxazole, polyamidoimide having an alicyclic structure, polyimide having an alicyclic structure, polyamide, and poly(p-xylylene).

Figure 6:
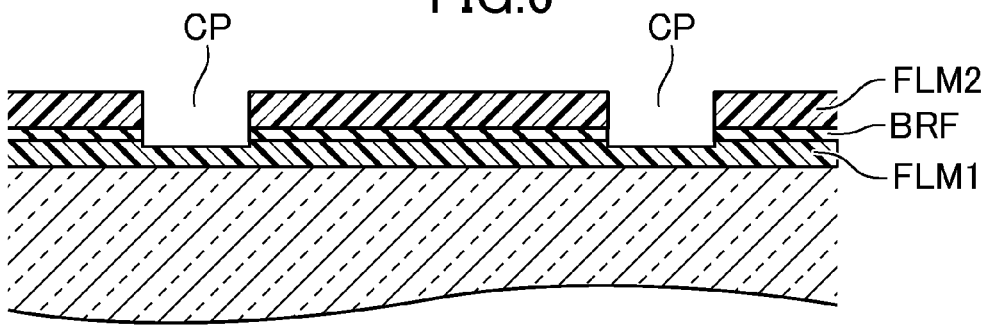
FIG. 6 is a diagram illustrating a method for manufacturing the liquid crystal display device which is the image display device according to the first embodiment of the invention.

1.3.4. Step 1-4 (FIGS. 6 and 13)

Subsequently, the grooves (recesses) CP are formed so as to penetrate through the resin film FLM2 from a front surface side of the resin film FLM2 and reach the barrier layer BRF by a known etching technique. At that time, as will be described in detail later, the grooves CP extend along cutting lines used when cutting the third substrate SUB3. Moreover, in the first embodiment, the depth of the grooves CP are larger than sum of the thicknesses of the resin film FLM1 and the barrier layer BRF (namely, the thickness of the resin film FLM1+the thickness of the barrier layer BRF) and are smaller than the sum of the thicknesses of the resin film FLM1, the barrier layer BRF, and the resin film FLM2 (namely, the thickness of the resin film FLM1+the thickness of the barrier layer BRF+the thickness of the resin film FLM2). By forming the grooves CP having such a depth, the grooves CP are formed so that the resin film FLM1 remains in bottom portions of the grooves CP. That is, in this step, parts on opposing surface sides of the resin film FLM1, the barrier layer BRF, and the resin film FLM2 are etched, whereby the grooves CP are formed along the cutting lines. In this way, regions of the resin film FLM2 surrounded by the grooves CP which extend in the X direction and are arranged in the Y direction and the grooves CP which extend in the Y direction and are arranged in the X direction are formed in a matrix form as shown in FIG. 13.

Figure 7:
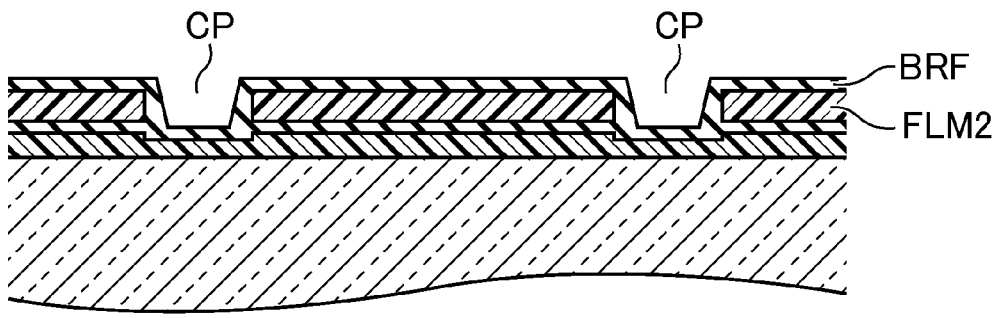
FIG. 7 is a diagram illustrating a method for manufacturing the liquid crystal display device which is the image display device according to the first embodiment of the invention.

1.3.5. Step 1-5 (FIG. 7)

Subsequently, the barrier layer (second barrier layer) BRF is formed on an upper surface of the resin film FLM2. At that time, the barrier layer BRF is formed on the entire upper surface of the third substrate SUB3 so that the barrier layer BRF is also formed on side surfaces of the resin film FLM2 (end portions of the resin film FLM2 and sidewall surfaces of the grooves CP). In this way, a resin film is formed so that the resin film FLM2 is covered by the barrier layer BRF on a rear surface side of the resin film FLM2, namely the barrier layer BRF between the resin film FLM1 and the resin film FLM2, the barrier layer BRF on the front surface side of the resin film FLM2, namely the barrier layer BRF between the resin film FLM2 and the TFT layer TFTL formed later, and the barrier layer BRF on the sidewall surfaces of the grooves CP. That is, a structure in which the resin film FLM2 is completely surrounded by the barrier layer BRF is obtained. Here, the barrier layer BRF formed in step 1-4 has the same configuration as the barrier layer BRF formed in step 1-2 described above.

Figure 8:
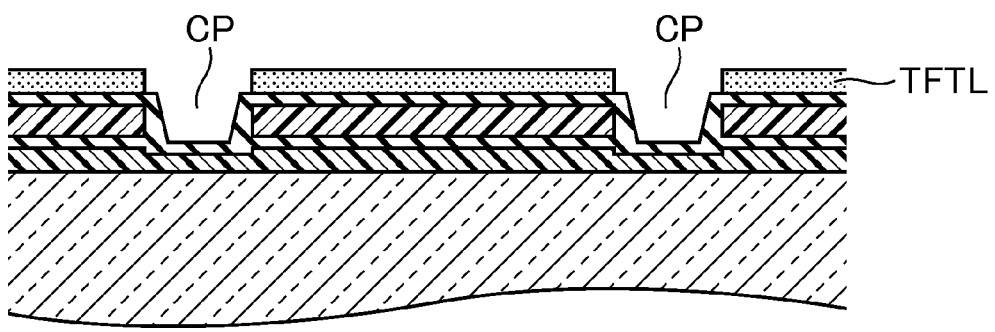
FIG. 8 is a diagram illustrating a method for manufacturing the liquid crystal display device which is the image display device according to the first embodiment of the invention.

1.3.6. Step 1-6 (FIG. 8)

Subsequently, the TFT layer TFTL including the known thin film transistors, electrodes, and the like is formed in a region of an upper surface of the barrier layer BRF excluding the grooves CP. By forming the TFT layer TFTL, it is possible to obtain a structure on a first substrate SUB1 side of the liquid crystal display device according to the first embodiment of the invention.

1.3.7. Step 1-7 (FIGS. 9 and 10)

Subsequently, an alignment film ORI is formed on an upper surface of the TFT layer TFTL, namely an upper surface region of the third substrate SUB3 excluding the grooves CP, and a predetermined alignment treatment is performed. After that, the mother substrate of the second substrate SUB2 on which color filters and a black matrix are formed is fixed to the third substrate SUB3 by a sealing material (not shown), and liquid crystals LC are enclosed therebetween. In this way, it is possible to obtain a configuration having the plurality of liquid crystal display devices which include unit display devices having the display region. In this way, one mother substrate is formed.

Figure 9:
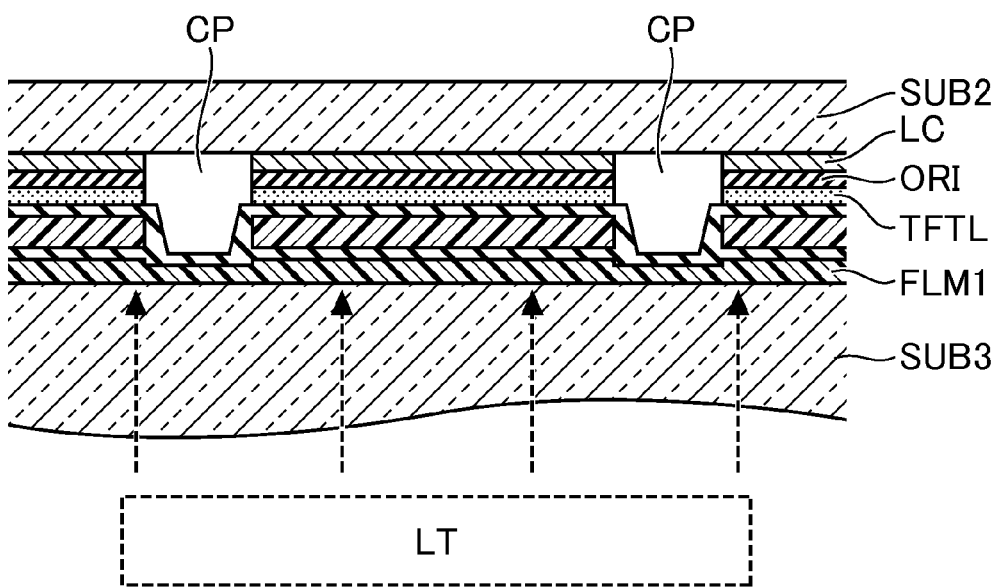
FIG. 9 is a diagram illustrating a method for manufacturing the liquid crystal display device which is the image display device according to the first embodiment of the invention.
Figure 10:
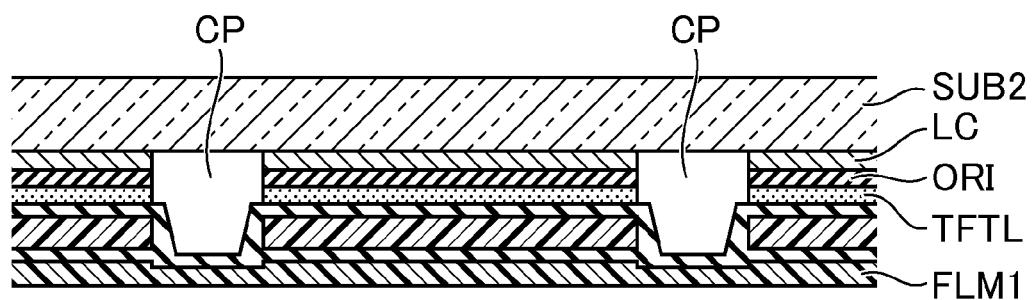
FIG. 10 is a diagram illustrating a method for manufacturing the liquid crystal display device which is the image display device according to the first embodiment of the invention.

Thereafter, as shown in FIG. 9, light LT is irradiated from a rear surface side of the third substrate SUB3, for example, namely the lower side in the figure of the third substrate SUB3, whereby the third substrate SUB3 is separated from the liquid crystal display device at a boundary between the third substrate SUB3 and the resin film FLM1 as shown in FIG. 10.

As the light LT used at that time, when a transparent substrate such as a glass substrate or a quartz substrate is used as the third substrate SUB3, laser light having a wavelength where a transmittance to these substrates is 90% or higher is preferred. As the laser light, specifically, XeCl excimer laser light having a wavelength of 308 nm, KrF excimer laser light having a wavelength of 248 nm, or a third harmonic (wavelength: 355 nm) or a fourth harmonic (wavelength: 266 nm) of a YAG laser (wavelength: 1064 nm) can be used. The laser light preferably has a wavelength of 200 nm or more and 450 nm or less, and more preferably a wavelength of 300 nm or more and 400 nm or less.

Furthermore, as the light LT, ultraviolet light may be used. The ultraviolet light in this case preferably has a wavelength of 200 nm or more and 450 nm or less, and specifically, g-line (wavelength: 436 nm), h-line (wavelength: 405 nm), and i-line (wavelength: 365 nm) which are bright lines of a mercury lamp or a xenon mercury lamp having a wavelength of 313 nm or 254 nm are preferred.

Although the light having the wavelength of 200 nm or more and 450 nm or less effectively passes the glass substrate as the third substrate SUB3, in most cases, the light in the wavelength band described above may barely pass through the resin film FLM1. Moreover, the resin films FLM1 and FLM2 preferably have a transmittance of 50% or less (preferably 10% or less) with respect to the light having the wavelength of 200 nm or more and 450 nm or less. Light having a wavelength where the transmittance to the resin films FLM1 and FLM2 is 10% or less is more preferred. The light having a wavelength where the transmittance to the resin films FLM1 and FLM2 is 50% or less (preferably 10% or less) is absorbed at the boundary between the third substrate SUB3 and the resin film FLM1 when irradiated from the rear surface of the third substrate SUB3, thus acting efficiently to cause easy separation.

Furthermore, after the light LT is irradiated, a step of assisting separation by applying a force to the boundary or a step of assisting separation by immersing the boundary in water to cause water to penetrate into the boundary may be added.

Figure 11:
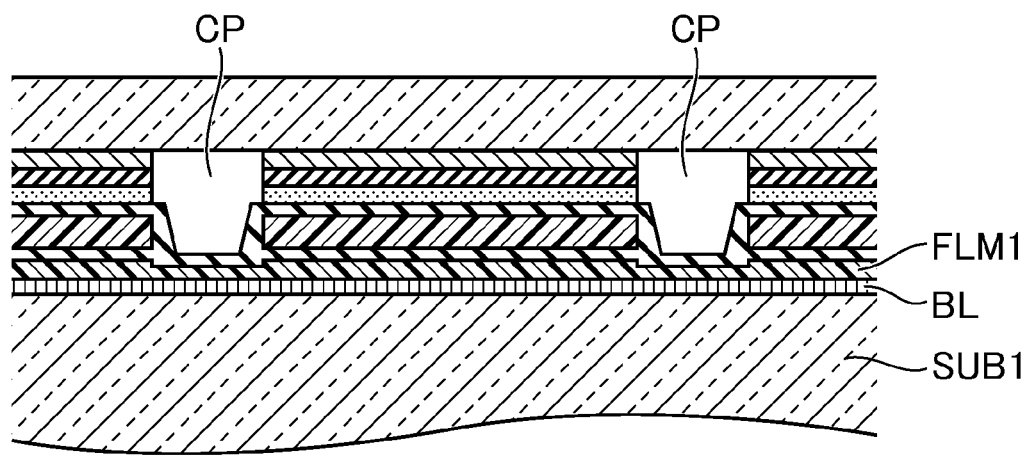
FIG. 11 is a diagram illustrating a method for manufacturing the liquid crystal display device which is the image display device according to the first embodiment of the invention.

1.3.8. Step 1-8 (FIG. 11)

Subsequently, an adhesive layer BL using a transparent adhesive is formed between the first substrate SUB1 which is a plastic substrate and the resin film FLM1, and the first substrate SUB1 and the resin film FLM1 are attached together. In this way, one mother substrate having the plurality of liquid crystal display devices which include the unit display devices having the display region is formed. After that, the respective liquid crystal display devices are cut along the cutting lines, whereby the plurality of liquid crystal display devices are formed from one mother substrate.

Since the first substrate SUB1 requires no particular heat resistance, a transparent substrate having a thickness of about 50 μm or more and 500 μm or less can be used. Examples having a transmittance of 90% or higher to light having a wavelength of 400 nm or more and 800 nm or less are preferred. A specific example of the first substrate SUB1 of the liquid crystal display device according to the first embodiment includes substrates including at least one material selected from polycarbonate and polyethersulfone, and HT substrate (TM) manufactured by Nippon Steel Chemical Co., Ltd., and the like are preferred. These substrates can be used in a process under a temperature of 200° C. When heating of the first substrate SUB1 during the manufacturing process is not necessary, APEL™ manufactured by Mitsui Chemicals Inc., ARTON™ manufactured by JSR Corp., ZEONOR™ manufactured by Zeon Corp., and the like which are cycloolefin copolymers can be used.

Figure 12:
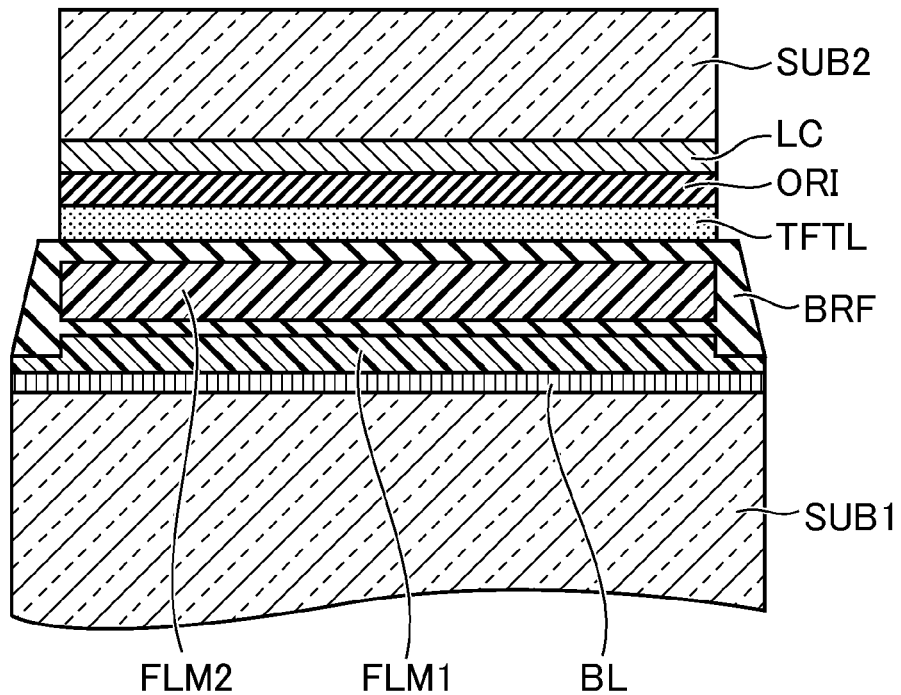
FIG. 12 is a cross-sectional view illustrating a detailed configuration of the liquid crystal display device according to the first embodiment of the invention.

FIG. 12 is a cross-sectional view illustrating a detailed configuration of the liquid crystal display device according to the first embodiment of the invention. Through steps 1-1 to 1-8, as shown in FIG. 12, the liquid crystal display device in which the first substrate SUB1 in which the adhesive layer BL, the resin film FLM1, the barrier layer BRF, the resin film FLM2, the barrier layer BRF, the TFT layer TFTL, and the alignment film ORI are formed in that order from the first substrate SUB1 side is disposed so as to face the second substrate SUB2 with the liquid crystals LC disposed therebetween can be obtained. At that time, the upper surface, the lower surface, and the sidewall surfaces of the resin film. FLM2 are covered by the barrier layer BRF. That is, since all the surfaces of the resin film FLM2 are covered by the barrier layer BRF, it is possible to prevent the moisture $H_2O$, oxygen $O_2$, and the like in the atmosphere from penetrating into the TFT layer TFTL. As a result, it is possible to suppress changes in the properties of the thin film transistors TFT formed on the TFT layer TFTL and to suppress fluctuation and the like of a display luminance in each pixel. Thus, it is possible to improve the display quality of the flexible liquid crystal display device in which the first substrate SUB1 is a plastic substrate.

In the liquid crystal display device of the first embodiment, as shown in FIG. 12, the resin film FLM1 may remain unremoved, and alternatively, the resin film FLM1 may be removed completely. In some cases, the resin film FLM1 may be removed completely by irradiation of the light LT in step 1-7. Moreover, the materials of the resin films FLM1 and FLM2, the barrier layer BRF (first barrier layer) formed in step 1-2, the barrier layer BRF (second barrier layer) formed in step 1-5, and the first, second, and third substrates SUB1, SUB2, and SUB3 are selected appropriately.

1.4. Description of Effects

Figure 44A:
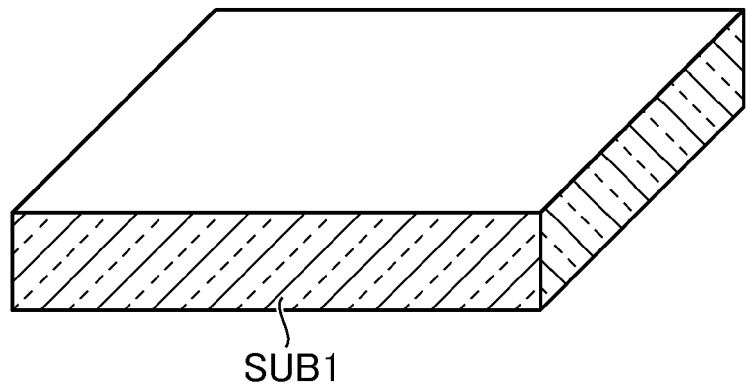
FIGS. 44A, 44b, and 44C are diagrams illustrating a method for manufacturing a liquid crystal display device according to the related art.
Figure 44B:
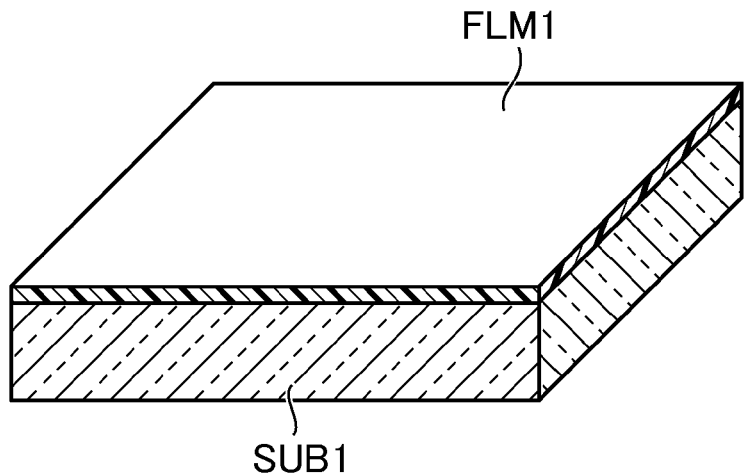
Figure 44C:
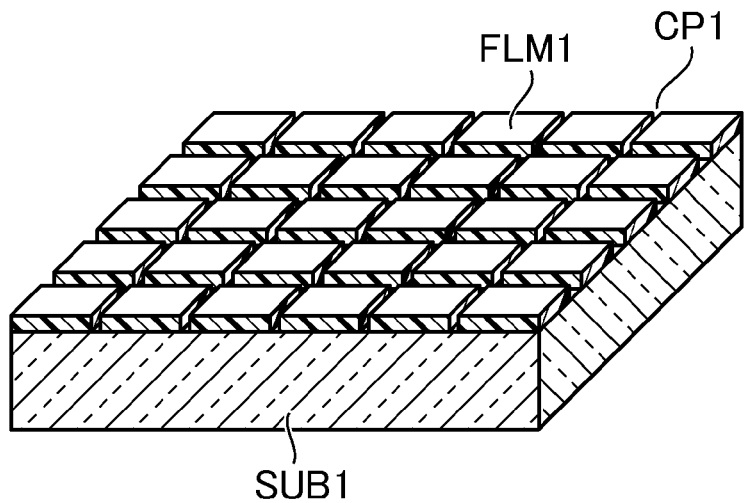
Figure 45:
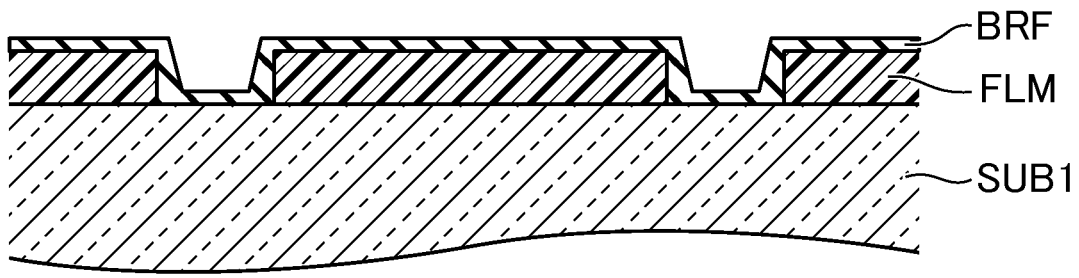
FIG. 45 is a cross-sectional view illustrating the method for manufacturing the liquid crystal display device according to the related art.
Figure 46:
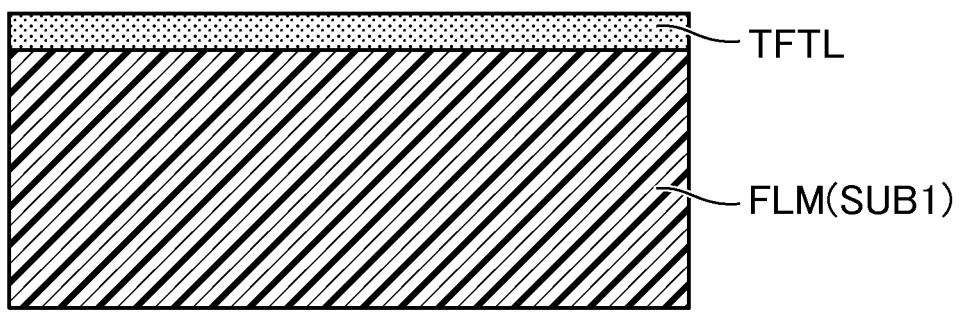
FIG. 46 is a diagram illustrating a schematic configuration of the liquid crystal display device according to the related art.
Figure 47:
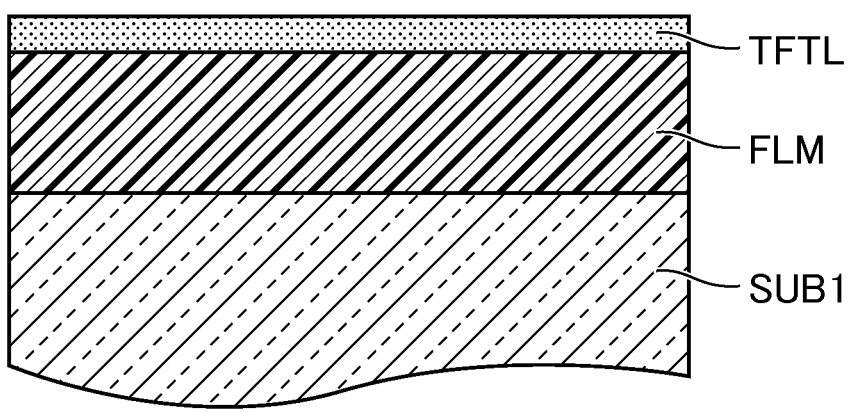
FIG. 47 is a diagram illustrating a schematic configuration of the liquid crystal display device according to the related art.
Figure 48:
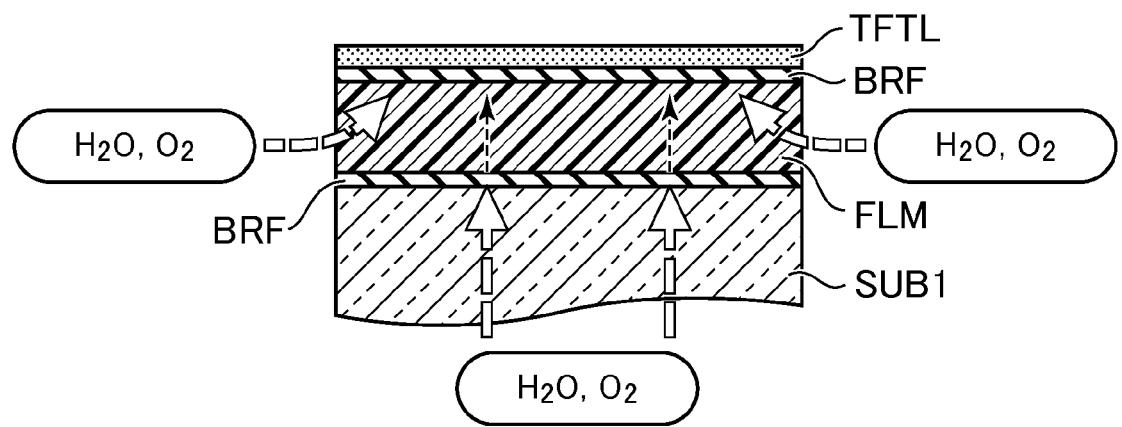
FIG. 48 is a diagram illustrating a schematic configuration of the liquid crystal display device according to the related art.

FIGS. 44A, 44B, and 44C are diagrams illustrating a method for manufacturing a liquid crystal display device according to the related art, and FIG. 45 is a cross-sectional diagram illustrating the method for manufacturing the liquid crystal display device according to the related art. The method for manufacturing the liquid crystal display device according to the related art shown in FIGS. 44A to 44C and FIG. 45 is disclosed in JP-2008-268666A.

In the manufacturing method of the related art, as shown in FIG. 44A, a glass substrate is used as a first substrate SUB1 which serves as a base member, and first, a resin film FLM1 is formed on a surface of the first substrate SUB1 as shown in FIG. 44B. Subsequently, the resin film FLM1 is etched to form grooves CP1 on the resin film FLM1 so as to reach the first substrate SUB1. Therefore, similarly to the invention, when a barrier layer BRF is formed after the grooves CP1 are formed, as shown in FIG. 45, the barrier layer BRF covers an upper surface and side surfaces of the resin film FLM1, and the barrier layer BRF is also formed on the surface of the first substrate SUB1 exposed by the forming of the grooves CP1. In this case, since a boundary between the barrier layer BRF and the first substrate SUB1 formed of the glass substrate is a bonding surface of an inorganic material and an inorganic material, they have good adhesion. Thus, it is very difficult to separate the barrier layer BRF from the first substrate SUB1. That is, since it is substantially not possible to form the barrier layer BRF so as to cover the side surfaces of the resin film FLM1, the above-described problems may not be solved. Due to the same reasons, it is substantially not possible to form the barrier layer BRF on a rear surface side of the resin film FLM1. Given the above, in the method for manufacturing the liquid crystal display device of the related art, it is difficult to form such a barrier layer BRF having a high barrier structure as disclosed in the invention.

2. Second Embodiment

2.1. Configuration

Figure 14:
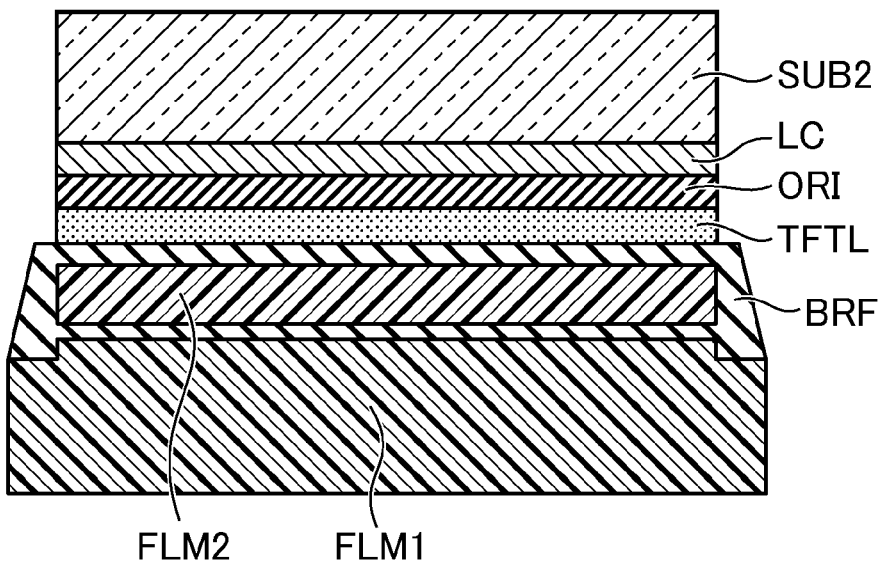
FIG. 14 is a cross-sectional view illustrating a schematic configuration of a liquid crystal display device which is an image display device according to a second embodiment of the invention.

FIG. 14 is a cross-sectional view illustrating a schematic configuration of a liquid crystal display device which is an image display device according to a second embodiment of the invention. In the liquid crystal display device of the second embodiment, a resin film FLM1 formed on a third substrate SUB3 is used as a first substrate SUB1. That is, in the liquid crystal display device of the second embodiment, the resin film FLM1 formed on the third substrate SUB3 is used as a base member.

As shown in FIG. 14, in the liquid crystal display device of the second embodiment, the resin film FLM1 is used as the base member on the side of the first substrate SUB1, namely the side where a TFT layer TFTL is formed, and a barrier layer BRF is formed on the resin film FLM1, and a resin film FLM2 is formed thereon. The barrier layer BRF is formed on an upper surface and side surfaces of the resin film FLM2, and the TFT layer TFTL is formed on the resin film FLM2 with the barrier layer BRF disposed therebetween. The substrate which is a substrate on such a TFT layer side and of which the base member is the resin film FLM1 is disposed so as to face a second substrate SUB2 with liquid crystals LC disposed therebetween.

As described above, in the liquid crystal display device of the second embodiment, since all the surfaces of the resin film FLM2 disposed under the TFT layer TFTL are covered by the barrier layer BRF, and are disposed under the TFT layer TFTL, the same effects as the liquid crystal display device of the first embodiment can be obtained.

Moreover, in the liquid crystal display device of the second embodiment, since the resin film FLM1 is used as the base member, a higher level of flexibility than the liquid crystal display device of the first embodiment can be obtained.

2.2. Manufacturing Method

Next, a method for manufacturing the liquid crystal display device according to the second embodiment will be described with reference to FIGS. 15 to 22. FIGS. 15 to 22 are diagrams illustrating the method for manufacturing the liquid crystal display device which is an image display device according to the second embodiment of the invention. The liquid crystal display device of the second embodiment has the same configuration as the liquid crystal display device of the first embodiment, except for a configuration in which the resin film FLM1 is used as the base member as described above. Therefore, in the following description, steps 2-1 to 2-8 which are the steps related to the configuration in which the resin film FLM1 is used as the base member will be described in detail.

Figure 15:
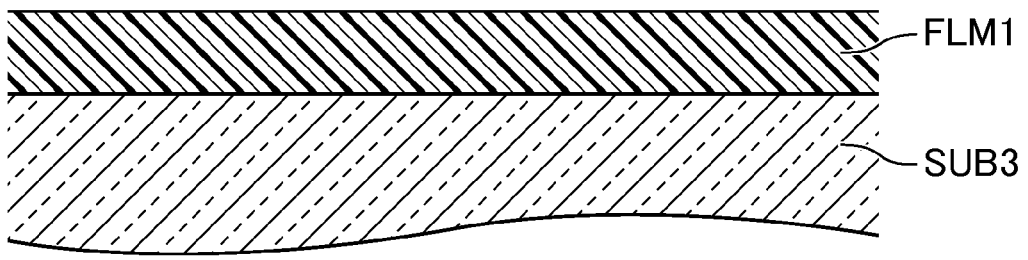
FIG. 15 is a diagram illustrating a method for manufacturing the liquid crystal display device which is the image display device according to the second embodiment of the invention.

2.2.1. Step 2-1 (FIG. 15).

First, the resin film FLM1 is formed on a surface of the third substrate SUB3 that is formed of a glass substrate. The resin film FLM1 becomes the base member for forming the TFT layer TFTL. A thickness of the resin film FLM1 at this time is sufficient for a thickness necessary for being used as the base member (support substrate).

Figure 16:
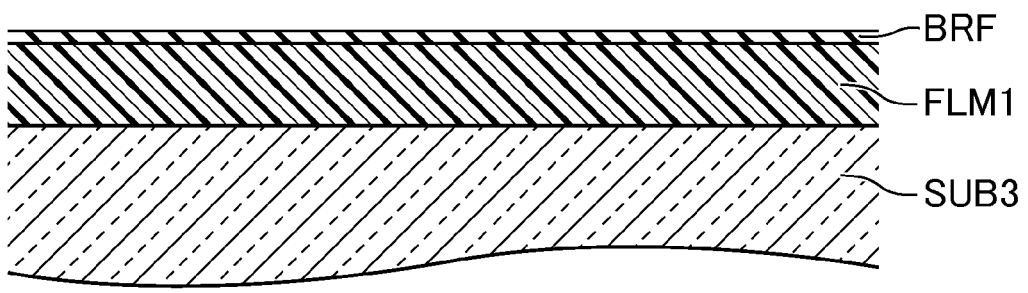
FIG. 16 is a diagram illustrating a method for manufacturing the liquid crystal display device which is the image display device according to the second embodiment of the invention.

2.2.2. Step 2-2 (FIG. 16)

Similarly to step 1-2 of the first embodiment, the barrier layer (first barrier layer) BRF is formed so as to cover an upper surface of the resin film FLM1.

Figure 17:
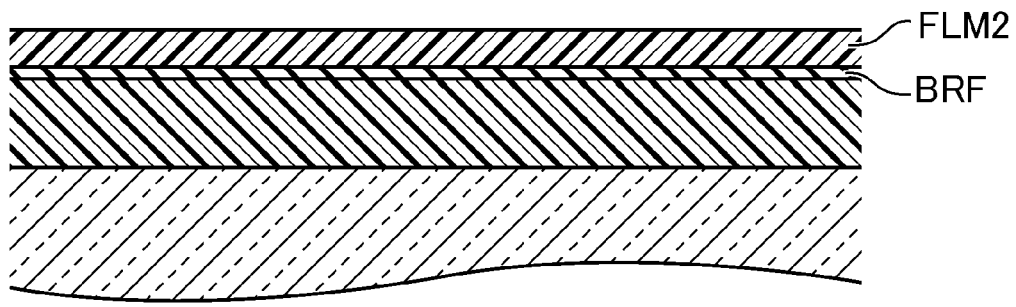
FIG. 17 is a diagram illustrating a method for manufacturing the liquid crystal display device which is the image display device according to the second embodiment of the invention.

2.2.3. Step 2-3 (FIG. 17)

Similarly to step 1-3 of the first embodiment, the resin film FLM2 is formed so as to cover an upper surface of the barrier layer BRF.

Figure 18:
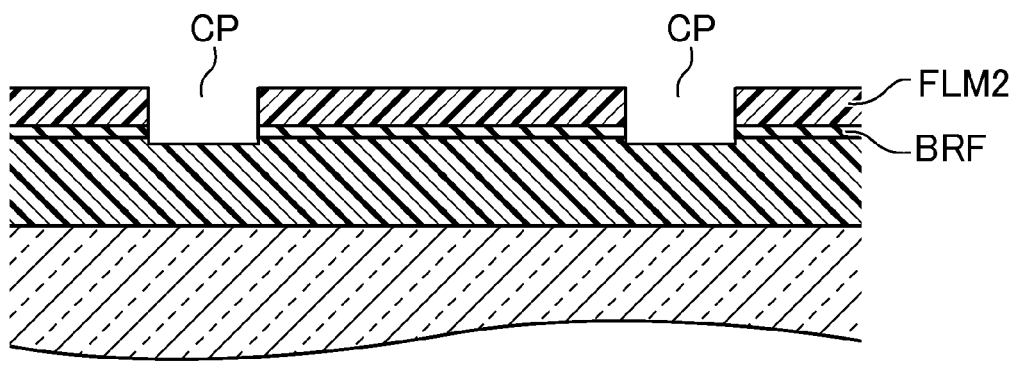
FIG. 18 is a diagram illustrating a method for manufacturing the liquid crystal display device which is the image display device according to the second embodiment of the invention.

2.2.4. Step 2-4 (FIG. 18)

Similarly to step 1-4 of the first embodiment, grooves (recesses) CP are formed so as to penetrate through the resin film FLM2 from a front surface side of the resin film FLM2 and reach the barrier layer BRF by a known etching technique.

Figure 19:
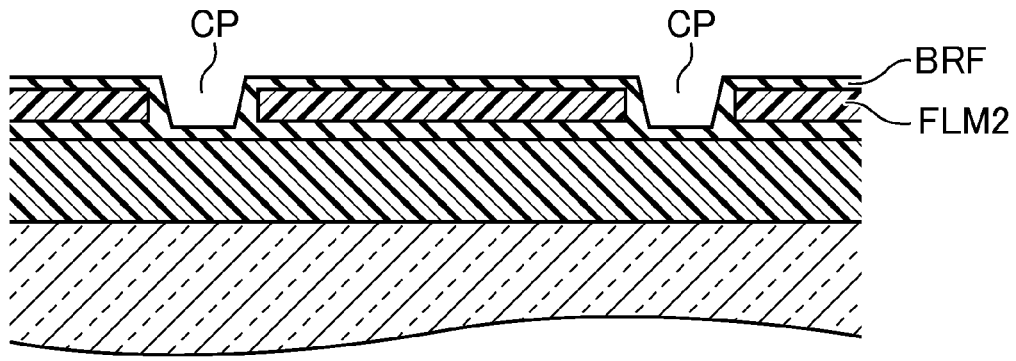
FIG. 19 is a diagram illustrating a method for manufacturing the liquid crystal display device which is the image display device according to the second embodiment of the invention.

2.2.5. Step 2-5 (FIG. 19)

Similarly to step 1-5 of the first embodiment, the barrier layer (second barrier layer) BRF is formed on the upper surface and the side surfaces of the resin film FLM2.

2.2.6. Step 2-6 (FIG. 20)

Similarly to step 1-6 of the first embodiment, the TFT layer TFTL including the known thin film transistors, electrodes, and the like is formed in a region of an upper surface of the barrier layer BRF excluding the grooves CP.

2.2.7. Step 2-7 (FIG. 21)

Similarly to step 1-7 of the first embodiment, first, an alignment film ORI is formed on an upper surface of the TFT layer TFTL, namely an upper surface region of the third substrate SUB3 excluding the grooves CP, and a predetermined alignment treatment is performed. After that, the mother substrate of the second substrate SUB2 on which color filters and a black matrix are formed is fixed to the third substrate SUB3 by a sealing material (not shown), and the liquid crystals LC are enclosed therebetween. In this way, a plurality of the liquid crystal display devices which include unit display devices having a display region is formed on one mother substrate.

Subsequently, light LT is irradiated from a surface side of the third substrate SUB3, namely the lower side in the figure of the third substrate SUB3, whereby the third substrate SUB3 is separated from the liquid crystal display device at a boundary between the third substrate SUB3 and the resin film FLM1.

2.2.8. Step 2-8 (FIG. 22)

By the separation of the liquid crystal display device and the third substrate SUB3 in step 2-7, as shown in FIG. 22, the mother substrate of the plurality of liquid crystal display devices which include the unit display devices having the display region, and in which a substrate facing the second substrate SUB2 is the resin film FLM1 is formed. After that, the respective liquid crystal display devices are cut along the cutting lines, whereby the plurality of liquid crystal display devices are formed from one mother substrate as shown in FIG. 14.

As described above, in the method for manufacturing the liquid crystal display device of the second embodiment, similarly to the method for manufacturing the liquid crystal display device of the first embodiment, by forming the barrier layer BRF in step 2-5 after the grooves CP are formed in step 2-4, it is possible to form the barrier layer BRF so as to cover the entire surface of the resin film FLM2 which is disposed under the TFT layer TFTL, namely on the resin film FLM1 side. As a result, the effects described in the first embodiment can be obtained.

3. Third Embodiment 3.1. Configuration

Figure 23:
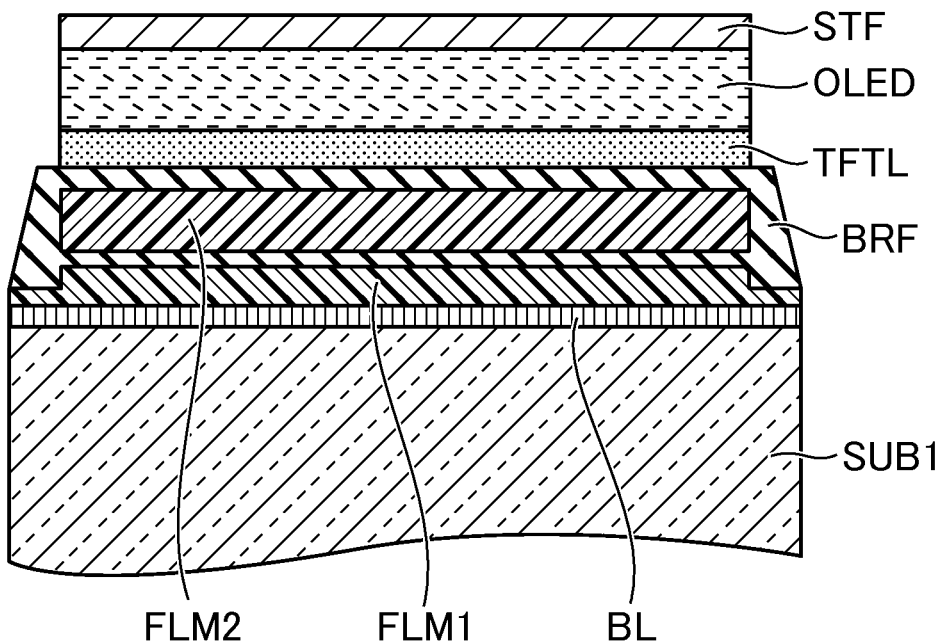
FIG. 23 is a cross-sectional view illustrating a schematic configuration of an organic EL display device which is an image display device according to a third embodiment of the invention.

FIG. 23 is a cross-sectional view illustrating a schematic configuration of an organic EL display device which is an image display device according to a third embodiment of the invention. As the organic EL display device of the third embodiment, a bottom emission-type organic EL display device in which a side where a TFT layer TFTL is formed, namely a first substrate SUB1 side is an observer side will be described. However, the invention can be applied to a top emission-type organic EL display device in which irradiation light emitted from a light emitting layer OLED does not pass through the TFT layer TFTL. In FIG. 23, a protection film PAS formed on a sealing layer STF is not illustrated.

As shown in FIG. 23, in the organic EL display device of the third embodiment, a plastic substrate serving as a base member is the first substrate SUB1, a resin film FLM1 is formed on the first substrate SUB1, a barrier layer (first barrier layer) BRF is formed on the resin film FLM1, and a resin film FLM2 is formed thereon. The barrier layer (second barrier layer) BRF is formed on an upper surface and side surfaces of the resin film. FLM2, and the TFT layer TFTL is formed on the resin film FLM2 with the barrier layer BRF disposed therebetween. The light emitting layer OLED is formed on the TFT layer TFTL, and the sealing layer STF is formed on the light emitting layer OLED. The light emitting layer constitutes an organic light emitting element.

As described above, in the organic EL display device of the third embodiment, all the surfaces of the resin film FLM2 disposed under the TFT layer TFTL are covered by the barrier layer BRF, and are disposed under the TFT layer TFTL. Therefore, similarly to the first embodiment, moisture $H_2O$, oxygen $O_2$, and the like in the atmosphere which penetrate into the resin film FLM2 through the first substrate SUB1 formed of a plastic substrate are blocked by the barrier layer BRF provided in a region between the first substrate SUB1 and the resin film FLM2 and prevented from penetrating into the resin film FLM2 side. Similarly, moisture $H_2O$, oxygen $O_2$, and the like which penetrate into the resin film FLM2 from side surface sides of the organic EL display device of the third embodiment, namely the atmosphere are blocked by the barrier layers BRF provided in the side surface portions of the resin film FLM2 and prevented from penetrating into the resin film FLM2 side. Moreover, in the organic EL display device of the third embodiment, the barrier layer BRF is also provided between the resin film FLM2 and the TFT layer TFTL. Therefore, even when part of the moisture $H_2O$, the oxygen $O_2$, and the like have penetrated through the barrier layer BRF provided in the region between the first substrate SUB1 and the resin film FLM2 or the barrier layer BRF provided in the side surface portions of the resin film FLM2, the barrier layer BRF between the resin film FLM2 and the TFT layer TFTL can prevent the moisture $H_2O$, the oxygen $O_2$, and the like which have penetrated from penetrating into the TFT layer TFTL.

Given the above, in the organic EL display device of the third embodiment, since all of outer circumferential surfaces of the resin film FLM2 formed on an upper surface side (an opposing surface side) of the first substrate SUB1 are covered by the barrier layer BRF, it is possible to prevent the moisture $H_2O$, the oxygen $O_2$, and the like in the atmosphere from penetrating into the TFT layer TFTL. As a result, it is possible to suppress changes in the properties of thin film transistors TFT formed on the TFT layer TFTL and to suppress fluctuation and the like of a display luminance in each pixel. Thus, it is possible to improve the display quality of the organic EL display device.

3.2. Manufacturing Method

Next, a method for manufacturing the organic EL display device according to the third embodiment will be described with reference to FIGS. 25 to 33. FIGS. 25 to 33 are diagrams illustrating the method for manufacturing the organic EL display device which is an image display device according to the third embodiment of the invention. In the organic EL display device of the third embodiment, steps (steps 3-1 to 3-6) before the protection film PAS is formed on the TFT layer TFTL are the same as those of the first embodiment. Therefore, in the following description, step 3-7 and the subsequent steps which are the steps related to forming of the protection film PAS will be described in detail.

Figure 25:
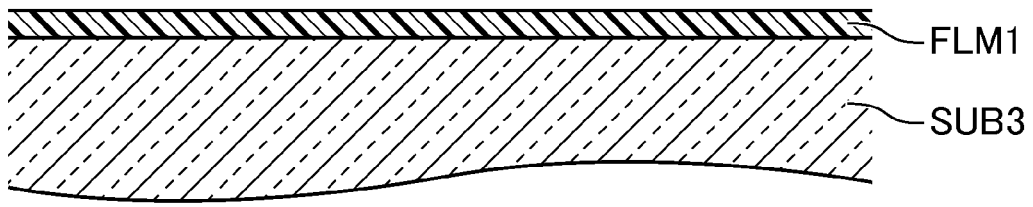
FIG. 25 is a diagram illustrating a method for manufacturing the organic EL display device which is the image display device according to the third embodiment of the invention.

3.2.1. Step 3-1 (FIG. 25)

First, the resin film FLM1 is formed on a surface of a third substrate SUB3 formed of a glass substrate serving as a base member for forming the TFT layer TFTL.

Figure 26:
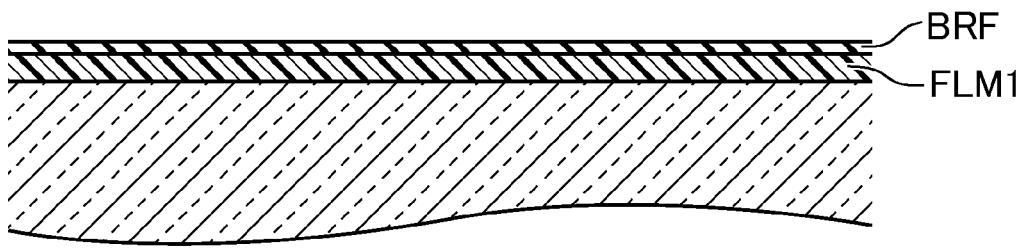
FIG. 26 is a diagram illustrating a method for manufacturing the organic EL display device which is the image display device according to the third embodiment of the invention.

3.2.2. Step 3-2 (FIG. 26)

Similarly to step 1-2 of the first embodiment, the barrier layer (first barrier layer) BRF is formed so as to cover an upper surface of a resin film FLM1.

Figure 27:
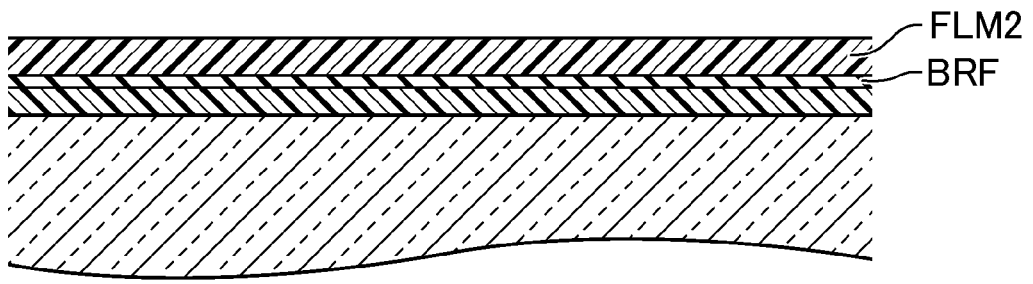
FIG. 27 is a diagram illustrating a method for manufacturing the organic EL display device which is the image display device according to the third embodiment of the invention.

3.2.3. Step 3-3 (FIG. 27)

Similarly to step 1-3 of the first embodiment, the resin film FLM2 is formed so as to cover an upper surface of the barrier layer BRF.

Figure 28:
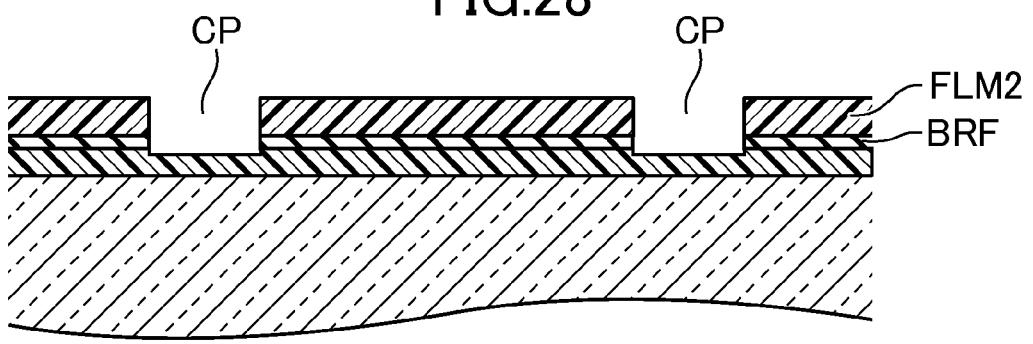
FIG. 28 is a diagram illustrating a method for manufacturing the organic EL display device which is the image display device according to the third embodiment of the invention.

3.2.4. Step 3-4 (FIG. 28)

Similarly to step 1-4 of the first embodiment, grooves (recesses) CP are formed so as to penetrate through the resin film FLM2 from a front surface side of the resin film FLM2 and reach the barrier layer BRF by a known etching technique.

Figure 29:
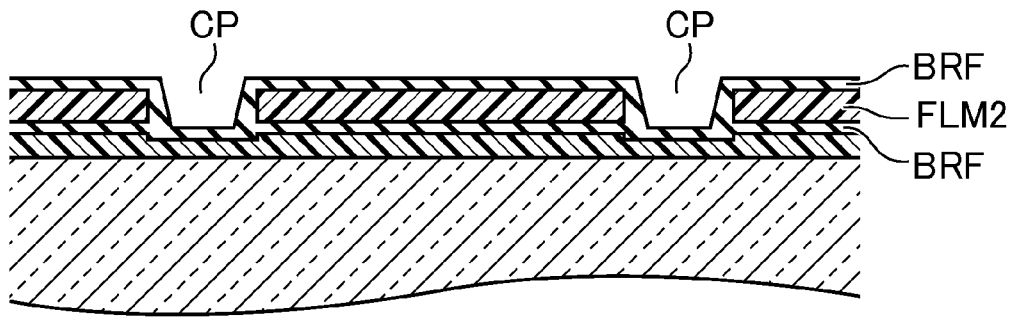
FIG. 29 is a diagram illustrating a method for manufacturing the organic EL display device which is the image display device according to the third embodiment of the invention.

3.2.5. Step 3-5 (FIG. 29)

Similarly to step 1-5 of the first embodiment, the barrier layer (second barrier layer) BRF is formed on the upper surface of the resin film FLM2.

Figure 30:
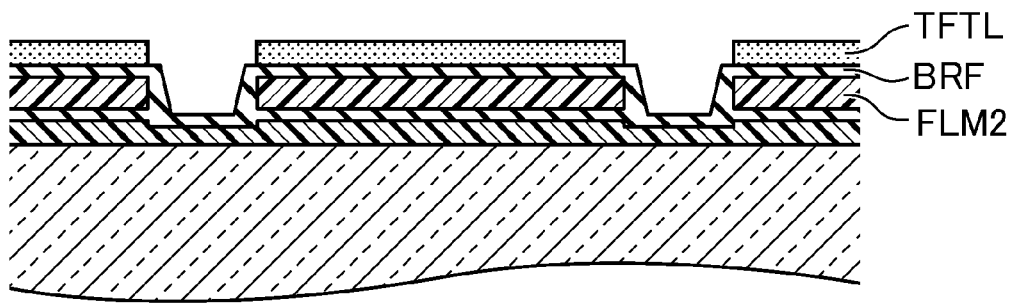
FIG. 30 is a diagram illustrating a method for manufacturing the organic EL display device which is the image display device according to the third embodiment of the invention.

3.2.6. Step 3-6 (FIG. 30)

Similarly to step 1-6 of the first embodiment, the TFT layer TFTL including the known thin film transistors, electrodes, and the like is formed in a region of the upper surface of the barrier layer BRF excluding the grooves CP.

Figure 31:
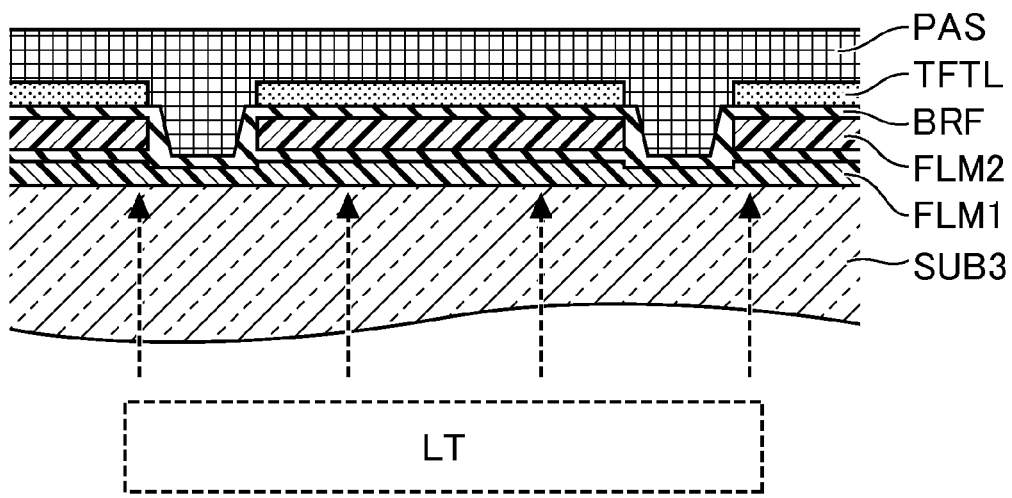
FIG. 31 is a diagram illustrating a method for manufacturing the organic EL display device which is the image display device according to the third embodiment of the invention.
Figure 32:
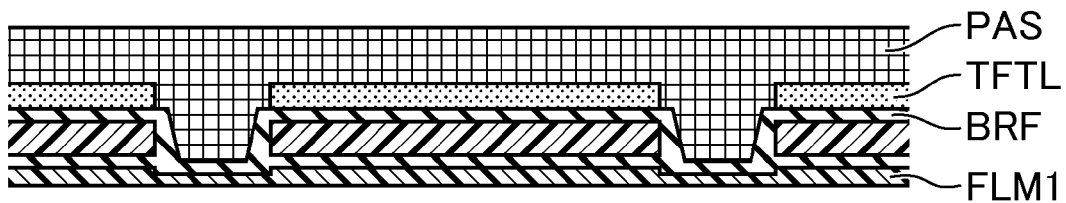
FIG. 32 is a diagram illustrating a method for manufacturing the organic EL display device which is the image display device according to the third embodiment of the invention.

3.2.7. Step 3-7 (FIGS. 31 and 32)

First, the light emitting layer OLED and the sealing layer STF which are not shown are formed on an upper surface of the TFT layer TFTL, and the protection film PAS is formed on the upper surface of the third substrate SUB3. Subsequently, light LT is irradiated from a rear surface side of the third substrate SUB3, namely the lower side in the figure of the third substrate SUB3, whereby the third substrate SUB3 is separated from the organic EL display device at a boundary between the third substrate SUB3 and the resin film FLM1. In this way, the organic EL display device shown in FIG. 32 is obtained.

Figure 33:
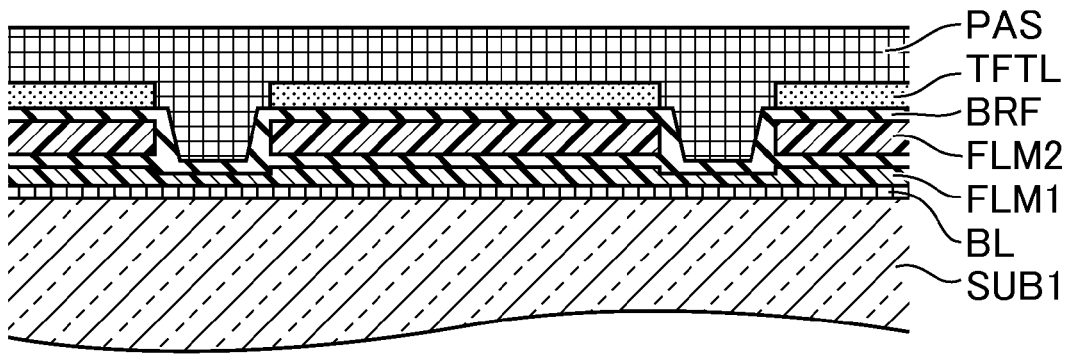
FIG. 33 is a diagram illustrating a method for manufacturing the organic EL display device which is the image display device according to the third embodiment of the invention.

3.2.8. Step 3-8 (FIG. 33)

Subsequently, an adhesive layer BL is formed between the first substrate SUB1 which is a plastic substrate and the resin film FLM1, and the first substrate SUB1 and the resin film FLM1 are attached together. In this way, one mother substrate is formed having a plurality of the organic EL display devices which include unit display devices having a display region on which the light emitting layer OLED is formed. After that, the respective organic EL display devices are cut along cutting lines, whereby the plurality of organic EL display devices are formed from one mother substrate.

As described above, in the process for manufacturing the organic EL display device of the third embodiment, by forming the barrier layer BRF in step 3-5 after the grooves CP are formed in step 3-4, it is possible to form the barrier layer BRF so as to cover the entire surface of the resin film FLM2 which is disposed under the TFT layer TFTL, namely on the first substrate SUB1 side. As a result, the effects described above can be obtained.

Figure 24:
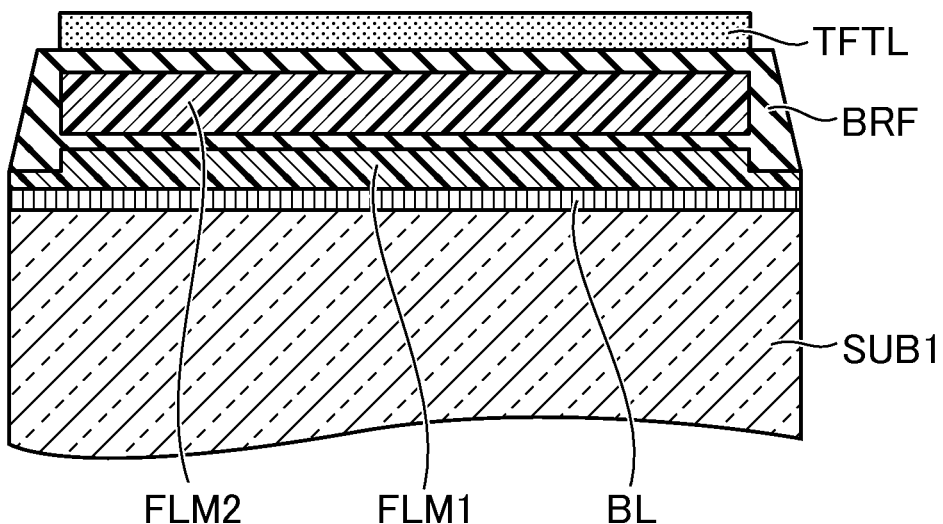
FIG. 24 is a diagram illustrating a configuration when the invention is applied to a semiconductor device.

In step 3-7 described above, by forming the protection film PAS on the upper surface of the third substrate SUB3 rather than forming the light emitting layer OLED and the sealing layer STF on the upper surface of the TFT layer TFTL, a semiconductor device including the TFT layer TFTL can be formed as shown in FIG. 24. In the semiconductor device, the resin film FLM1, the barrier layer (first barrier layer) BRF, the resin film FLM2, the barrier layer (second barrier layer) BRF, and the TFT layer TFTL are sequentially formed on the first substrate SUB1 serving as a base member, and the barrier layer BRF is formed on the side surface portions of the resin film FLM2. Thus, it is possible to suppress changes in the properties of the thin film transistors that constitute the semiconductor device.

4. Fourth Embodiment 4.1. Configuration

Figure 34:
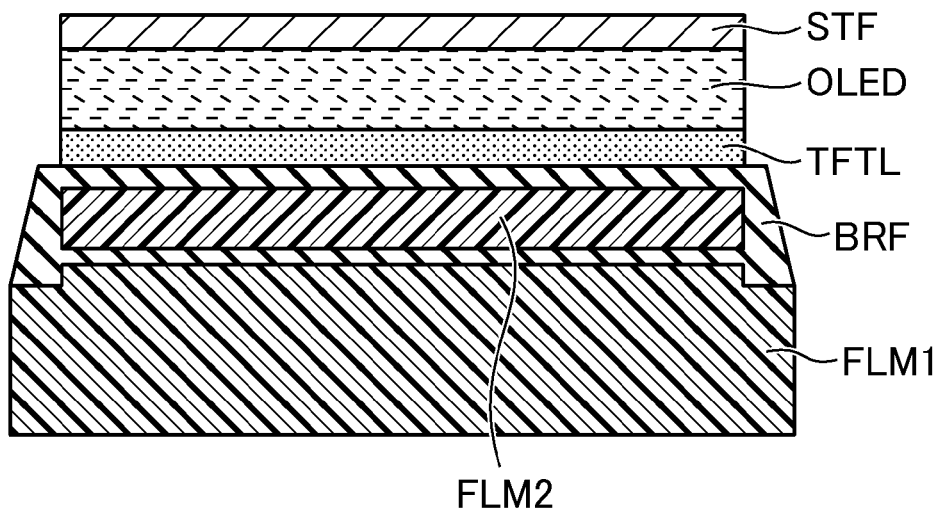
FIG. 34 is a cross-sectional view illustrating a schematic configuration of an organic EL display device which is an image display device according to a fourth embodiment of the invention.

FIG. 34 is a cross-sectional view illustrating a schematic configuration of an organic EL display device which is an image display device according to a fourth embodiment of the invention. In the organic EL display device of the fourth embodiment, similarly to the second embodiment, a resin film FLM1 formed on a third substrate SUB3 instead of a first substrate SUB1 is used as a base member of the display device.

As shown in FIG. 34, in the organic EL display device of the fourth embodiment, similarly to the display device of the second embodiment, the resin film FLM1 is used as a base member on the side where a TFT layer TFTL is formed, and a barrier layer BRF is formed on the resin film FLM1, and a resin film FLM2 is formed thereon. The barrier layer BRF is formed on an upper surface and side surfaces of the resin film FLM2, and the TFT layer TFTL is formed on the resin film FLM2 with the barrier layer BRF disposed therebetween. Moreover, a light emitting layer OLED is formed on the TFT layer TFTL, and a sealing layer STF is formed on the light emitting layer OLED.

As described above, in the organic EL display device of the fourth embodiment, since all the surfaces of the resin film FLM2 disposed under the TFT layer TFTL are covered by the barrier layer BRF, and are disposed under the TFT layer TFTL, the same effects as the image display devices of the first to third embodiments can be obtained.

Moreover, in the organic EL display device of the fourth embodiment, since the resin film FLM1 is used as a base member, a higher level of flexibility than the organic EL display device of the third embodiment can be obtained.

4.2. Manufacturing Method

Next, a method for manufacturing the organic EL display device according to the fourth embodiment will be described with reference to FIGS. 35 to 42. FIGS. 35 to 42 are diagrams illustrating the method for manufacturing the organic EL display device which is an image display device according to the fourth embodiment of the invention. The organic EL display device of the fourth embodiment has the same configuration as the organic EL display device of the third embodiment, except for a configuration in which the resin film FLM1 is used as the base member as described above. Therefore, in the following description, steps 4-1 to 4-8 which are the steps related to the configuration in which the resin film FLM1 is used as the base member will be described in detail.

Figure 35:
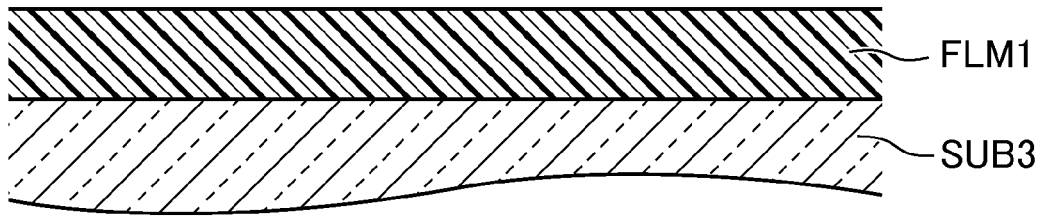
FIG. 35 is a diagram illustrating a method for manufacturing the organic EL display device which is the image display device according to the fourth embodiment of the invention.

4.2.1. Step 4-1 (FIG. 35).

First, similarly to step 2-1 of the second embodiment, the resin film FLM1 is formed on a surface of the third substrate SUB3 that is formed of a glass substrate. The resin film FLM1 becomes a base member for forming the TFT layer TFTL.

Figure 36:
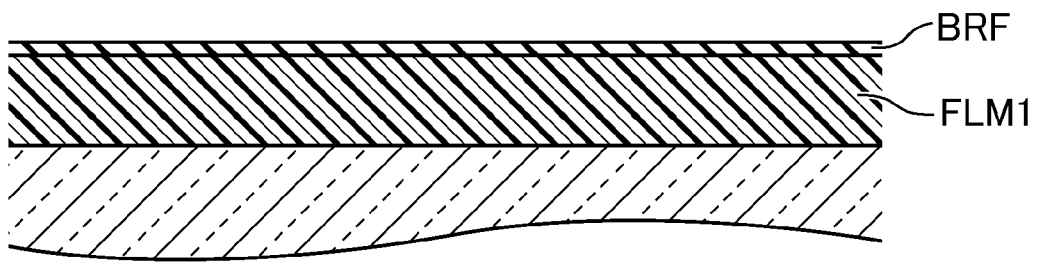
FIG. 36 is a diagram illustrating a method for manufacturing the organic EL display device which is the image display device according to the fourth embodiment of the invention.

4.2.2. Step 4-2 (FIG. 36)

Similarly to step 3-2 of the third embodiment, the barrier layer (first barrier layer) BRF is formed so as to cover an upper surface of the resin film FLM1.

Figure 37:
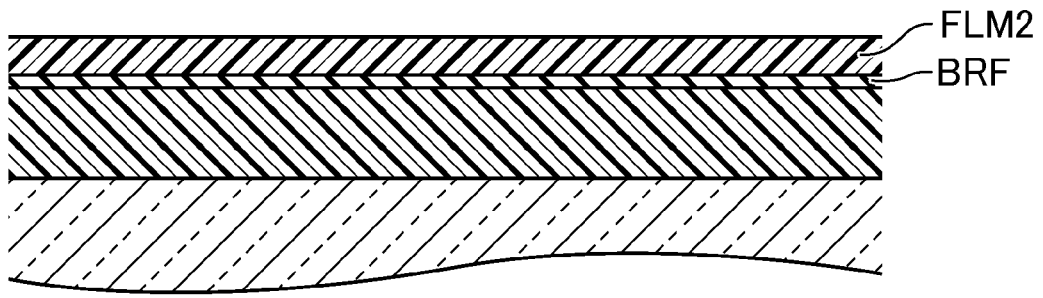
FIG. 37 is a diagram illustrating a method for manufacturing the organic EL display device which is the image display device according to the fourth embodiment of the invention.

4.2.3. Step 4-3 (FIG. 37)

Similarly to step 3-3 of the third embodiment, the resin film FLM2 is formed so as to cover an upper surface of the barrier layer BRF.

Figure 38:
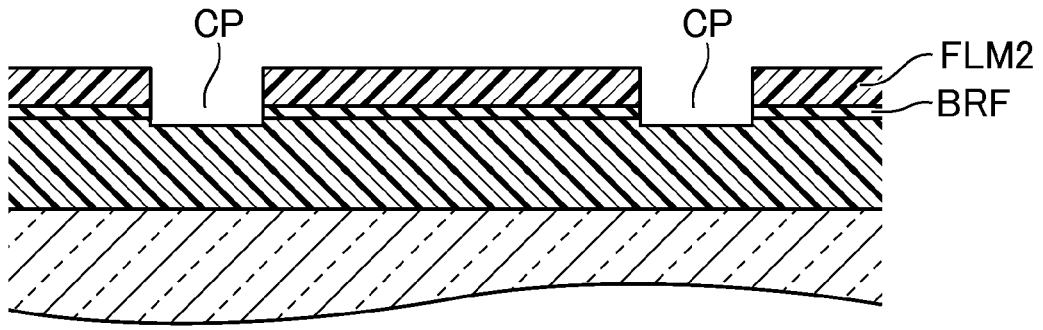
FIG. 38 is a diagram illustrating a method for manufacturing the organic EL display device which is the image display device according to the fourth embodiment of the invention.

4.2.4. Step 4-4 (FIG. 38)

Similarly to step 3-4 of the third embodiment, grooves (recesses) CP are formed so as to penetrate through the resin film FLM2 from a front surface side of the resin film FLM2 and reach the barrier layer BRF by a known etching technique.

Figure 39:
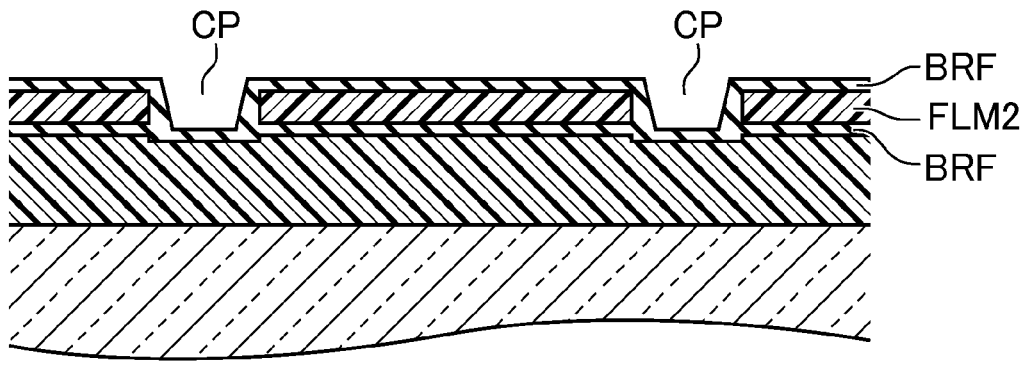
FIG. 39 is a diagram illustrating a method for manufacturing the organic EL display device which is the image display device according to the fourth embodiment of the invention.

4.2.5. Step 4-5 (FIG. 39)

Similarly to step 3-5 of the third embodiment, the barrier layer (second barrier layer) BRF is formed on the upper surface of the resin film FLM2.

Figure 40:
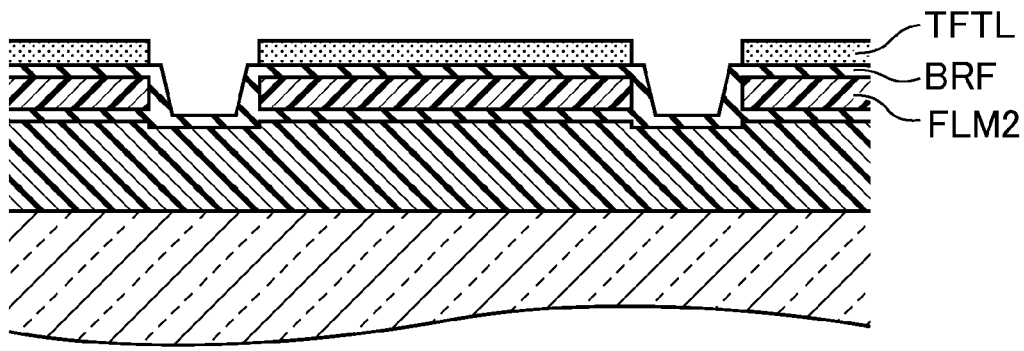
FIG. 40 is a diagram illustrating a method for manufacturing the organic EL display device which is the image display device according to the fourth embodiment of the invention.

4.2.6. Step 4-6 (FIG. 40)

Similarly to step 3-6 of the third embodiment, the TFT layer TFTL including the known thin film transistors, electrodes, and the like is formed in a region of an upper surface of the barrier layer BRF excluding the grooves CP.

Figure 41:
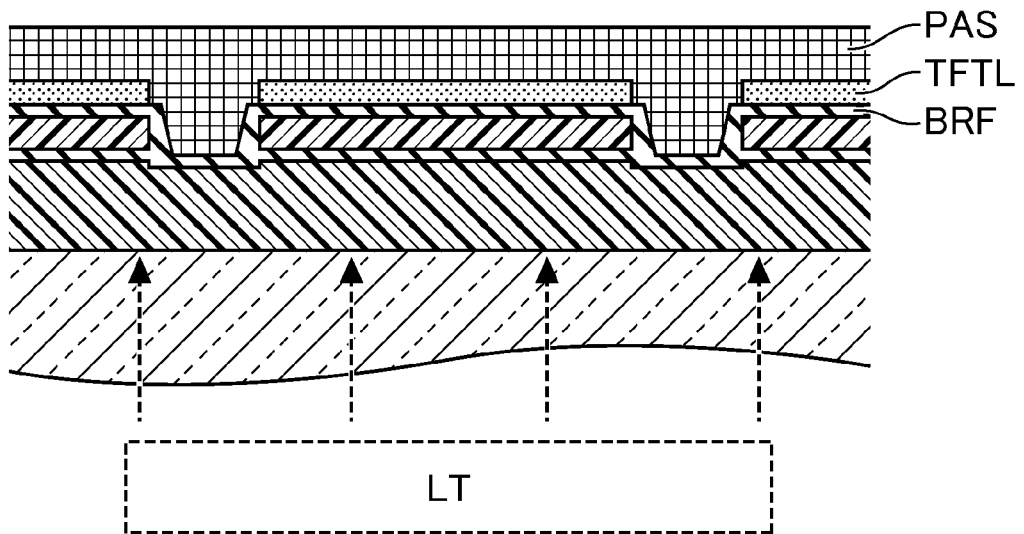
FIG. 41 is a diagram illustrating a method for manufacturing the organic EL display device which is the image display device according to the fourth embodiment of the invention.

4.2.7. Step 4-7 (FIG. 41)

Similarly to step 3-7 of the third embodiment, first, the light emitting layer OLED and the sealing layer STF which are not shown are formed on an upper surface of the TFT layer TFTL, and a protection film PAS is formed on the upper surface of the third substrate SUB3. Subsequently, light LT is irradiated from a rear surface side of the third substrate SUB3, namely the lower side in the figure of the third substrate SUB3, whereby the third substrate SUB3 is separated from the organic EL display device at a boundary between the third substrate SUB3 and the resin film FLM1.

4.2.8. Step 4-8 (FIG. 42)

Figure 42:
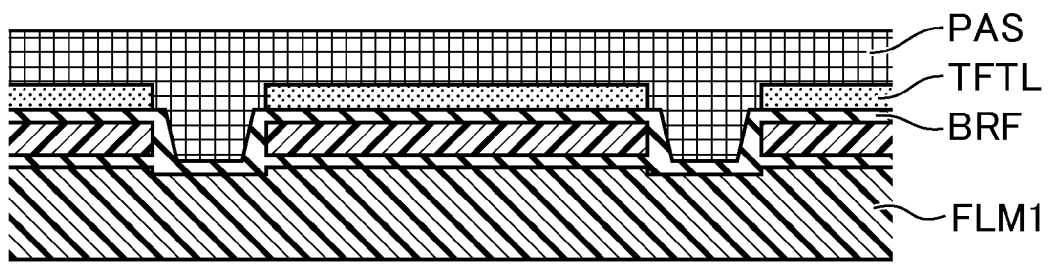
FIG. 42 is a diagram illustrating a method for manufacturing the organic EL display device which is the image display device according to the fourth embodiment of the invention.

By the separation of the organic EL display device and the third substrate SUB3 in step 4-7, as shown in FIG. 42, a mother substrate of a plurality of the organic EL display devices which includes unit display devices having a display region, and in which a substrate is the resin film FLM1 is formed. After that, the respective organic EL display devices are cut along cutting lines, whereby the plurality of organic EL display devices are formed from one mother substrate.

As described above, in the method for manufacturing the liquid crystal display device of the fourth embodiment, similarly to the method for manufacturing the liquid crystal display device of the first embodiment, by forming the barrier layer BRF in step 4-5 after the grooves CP are formed in step 4-4, it is possible to form the barrier layer BRF so as to cover the entire surface of the resin film FLM2 which is disposed under the TFT layer TFTL, namely on the resin film FLM1 side. As a result, the effects described above can be obtained.

Figure 43:
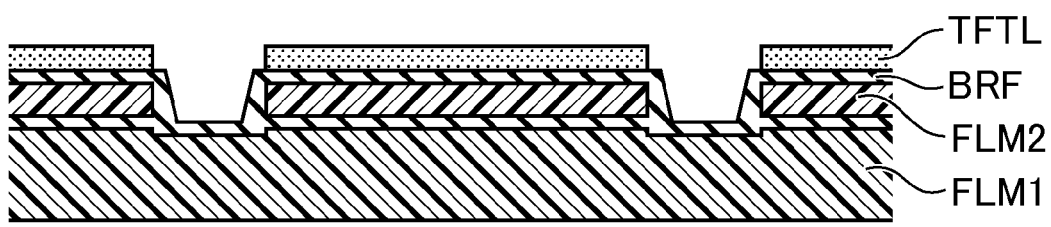
FIG. 43 is a diagram illustrating a configuration when the invention is applied to a semiconductor device.

Moreover, in the liquid crystal display device of the fourth embodiment, similarly to the liquid crystal display device of the third embodiment, since the light emitting layer OLED and the sealing layer STF are not formed on the upper surface of the TFT layer TFTL in step 4-7, a semiconductor device including the TFT layer TFTL can be formed as shown in FIG. 43. In the semiconductor device, the barrier layer (first barrier layer) BRF, the resin film FLM2, the barrier layer (second barrier layer) BRF, and the TFT layer TFTL are sequentially formed on the resin film FLM1 serving as a base member instead of the first substrate SUB1, and the barrier layer BRF is formed on the side surface portions of the resin film FLM2. Thus, it is possible to suppress changes in the properties of the thin film transistors that constitute the semiconductor device.

Although in the first and second embodiments of the invention, the invention is applied to an IPS mode liquid crystal display device which is an example of an image display device, the invention is not limited to this, and can be applied to TN or VA mode liquid crystal display devices.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A method for manufacturing an image display device, comprising:
    forming a resin layer on a substrate;
    forming a semiconductor element comprising thin film transistors on the resin layer;
    forming grooves that are shallower than a thickness of the resin layer on an upper surface side of the resin layer;
    irradiating light to the resin layer from a side of the resin layer on which the substrate exists after forming the grooves; and
    separating the substrate from the resin layer on which the semiconductor element is formed;
    wherein a part of the resin layer remains on bottom portions of the grooves;
    wherein the resin layer comprises a first resin layer and a second resin layer;
    wherein the forming the resin layer on the substrate comprises:
    forming the second resin layer on the substrate;
    forming a barrier layer that is formed of an inorganic material on the second resin layer; and
    forming the first resin layer on the barrier layer; and
    wherein the forming the grooves on the upper surface side of the resin layer comprises forming the grooves so as to penetrate through the first resin layer and the barrier layer so that the part of the second resin layer remains on the bottom portions of the grooves.

2. The method for manufacturing the image display device according to claim 1, further comprising
    cutting the image display device for at least one display region formed on a region where the semiconductor element is formed,
    wherein the grooves are formed so as to overlap cutting positions.

* * * * *